US012796452B2

(12) United States Patent
Chin et al.

(10) Patent No.: US 12,796,452 B2

(45) Date of Patent: Nov. 10, 2026

(54) INTEGRATED CHIP INCLUDING A CAPACITOR ARRAY

(71) Applicant: Taiwan Semiconductor Manufacturing Company, Ltd., Hsinchu (TW)

(72) Inventors: Shu-Cheng Chin, Hsinchu (TW); Kong-Beng Thei, Pao-Shan Village (TW); Jung-Hui Kao, Hsin-Chu (TW); Wen-Ting Hsiao, Miaoli County (TW); Kuei-Kai Hou, New Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 735 days.

(21) Appl. No.: 18/150,385

(22) Filed: Jan. 5, 2023

(65) Prior Publication Data

US 2024/0186235 A1 Jun. 6, 2024

Related U.S. Application Data

(60) Provisional application No. 63/430,111, filed on Dec. 5, 2022.

(51) Int. Cl.

| | |
|---|---|
| ***H10W 20/40*** | (2026.01) |
| ***H10D 1/68*** | (2025.01) |
| ***H10W 90/00*** | (2026.01) |
| *H10W 72/29* | (2026.01) |
| *H10W 72/90* | (2026.01) |
| *H10W 74/15* | (2026.01) |

(52) U.S. Cl.

CPC .......... *H10W 20/496* (2026.01); *H10D 1/696* (2025.01); *H10W 90/701* (2026.01); *H10W 72/29* (2026.01); *H10W 72/9223* (2026.01); *H10W 72/923* (2026.01); *H10W 74/15* (2026.01); *H10W 90/724* (2026.01)

(58) Field of Classification Search

CPC .......... H10W 20/496; H01L 2224/0401; H10P 58/00

See application file for complete search history.

(56) References Cited

U.S. PATENT DOCUMENTS

| | | | | |
|---|---|---|---|---|
| 2003/0052409 A1* | 3/2003 | Matsuo | H10W 72/20 257/E21.705 |
| 2011/0210422 A1* | 9/2011 | Imamura | H10W 20/496 257/532 |
| 2013/0168740 A1 | 7/2013 | Chen | |
| 2019/0326296 A1* | 10/2019 | Wang | H10B 12/315 |
| 2021/0118782 A1 | 4/2021 | Huang et al. | |
| 2022/0051993 A1* | 2/2022 | Chen | H10W 42/00 |
| 2022/0216192 A1 | 7/2022 | Jeng et al. | |

* cited by examiner

*Primary Examiner* — Yu-Hsi D Sun

(74) *Attorney, Agent, or Firm* — Eschweiler & Potashnik, LLC

(57) ABSTRACT

An integrated chip including a substrate and a transistor device along the substrate. A plurality of conductive interconnects are over the transistor device. A first under-bump metal (UBM) layer is over the conductive interconnects. A first metal bump is directly over the first UBM layer. A metal-insulator-metal (MIM) capacitor array is over the transistor device and under the first UBM layer. The MIM capacitor array includes a first MIM capacitor and a second MIM capacitor coupled in parallel and disposed directly under the first UBM layer.

20 Claims, 20 Drawing Sheets

INTEGRATED CHIP INCLUDING A CAPACITOR ARRAY

REFERENCE TO RELATED APPLICATION

This application claims the benefit of U.S. Provisional Application No. 63/430,111, filed on Dec. 5, 2022, the contents of which are hereby incorporated by reference in their entirety.

BACKGROUND

Modern day integrated chips contain millions of semiconductor devices. The semiconductor devices are electrically interconnected by way of back-end-of-the-line (BEOL) metal interconnect layers that are formed above the devices. A typical integrated chip comprises a plurality of BEOL metal interconnect layers including different sized metal wires vertically coupled together with metal vias. Metal bumps are typically included over the BEOL metal interconnect for coupling during chip packaging. Integrated chips also often include metal-insulator-metal (MIM) capacitors above the semiconductor devices and between BEOL interconnect layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
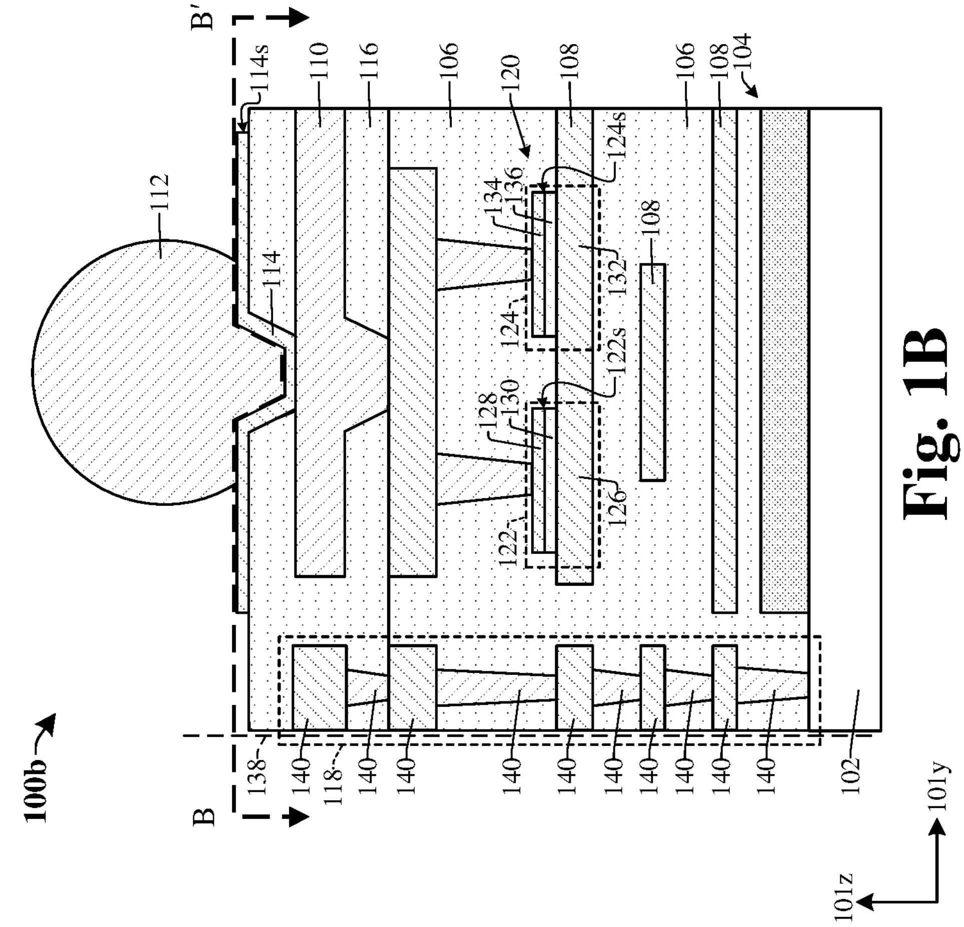
FIG. 1B illustrates another cross-sectional view of some embodiments of the integrated chip of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for case of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip includes a transistor device (e.g., a metal oxide field effect transistor (MOSFET) or the like) along a semiconductor substrate. Conductive interconnects (e.g., metal lines, metal vias, metal contacts, metal landing pads, or the like) are over the transistor device. A redistribution layer (RDL) is over the conductive interconnects. A seal ring structure laterally surrounds the conductive interconnects and the RDL along a perimeter of the integrated chip. An under-bump metal (UBM) layer is over the RDL and adjacent to the seal ring. A metal bump is directly over the UBM layer. A metal-insulator-metal (MIM) capacitor is over the semiconductor device and under the RDL.

The MIM capacitor may be arranged along the perimeter of the integrated chip. For example, the MIM capacitor is adjacent to the seal ring and/or directly under the UBM layer. However, in some instances, when the MIM capacitor is disposed near the seal ring, a likelihood of the MIM capacitor being damaged during chip dicing may be increased. For example, when the integrated chip is diced along the seal ring, the dicing process may put stress on the nearby MIM capacitor which may damage MIM capacitor. Further, when the MIM capacitor is disposed directly under the UBM layer, a likelihood of the MIM capacitor suffering damage during the packaging of the integrated chip may be increased. For example, when the integrated chip is bonded to another structure (e.g., a bond pad on another chip, a bond pad on a circuit board, a bond pad on a circuit film, or the like) at the metal bump during packing, the force applied to the metal bump and the underlying UBM layer during the bonding may put stress on the underlying MIM capacitor which may damage the MIM capacitor. Thus, when the MIM capacitor is arranged along the perimeter of the integrated chip (e.g., near the seal ring and/or directly under the UBM layer), a likelihood of the MIM capacitor being damaged may be increased.

To reduce the likelihood of MIM capacitor damage during dicing and/or packaging, the MIM capacitor may be laterally spaced apart from the chip perimeter (e.g., from the seal ring) by a minimum distance. For example, the MIM capacitor is spaced apart from the perimeter of the integrated chip and positioned so that the MIM capacitor is not directly under the UBM layer. However, as a size of the integrated chip is reduced as technology advances, the area of the integrated chip may not be large enough to accommodate the minimum spacing between the MIM capacitor and the perimeter of the integrated chip. Thus, a total capacitance on the chip may be reduced because the available area for the MIM capacitor is reduced.

Various embodiments of the present disclosure are related to an integrated chip including a MIM array disposed along the perimeter of the integrated chip. For example, the MIM array is over a transistor device, under a UBM layer, and adjacent to a seal ring. The MIM array comprises a plurality of MIM capacitors coupled in parallel. The MIM capacitors of the MIM array are arranged along the perimeter of the integrated chip (e.g., near the seal ring) and/or directly under the UBM layer. Further, the MIM capacitors have reduced areas (e.g., when viewed from above). Because the MIM capacitors have reduced areas, the MIM capacitors can sustain higher stress than a single, larger MIM capacitor having the same capacitance as the MIM array. Because the MIM capacitors of the MIM array can sustain higher stress, a likelihood of the MIM capacitors being damaged during dicing and/or packing when the MIM capacitors are disposed directly under the UBM layer and/or adjacent to the seal ring can be reduced. Further, by disposing the MIM capacitors directly under the UBM layer and/or adjacent to the seal ring, the total area available on the chip for the MIM capacitors can be increased (e.g., unutilized spaced can be reduced).

Figure 1A:
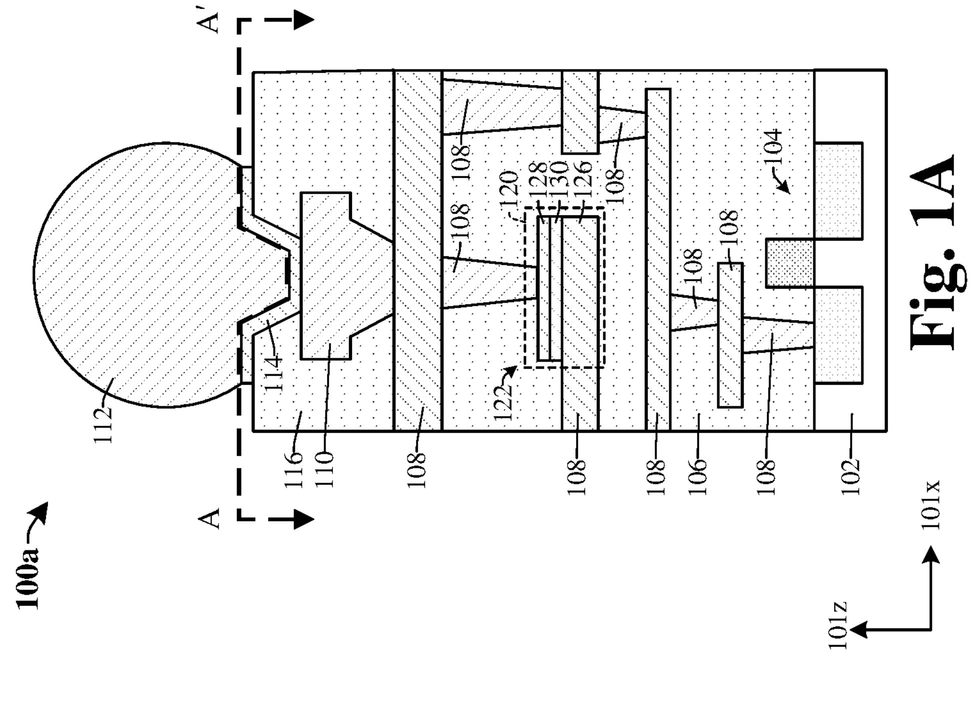
FIG. 1A illustrates a cross-sectional view of some embodiments of an integrated chip comprising a metal-insulator-metal (MIM) array arranged along a perimeter of the integrated chip.
Figure 1C:
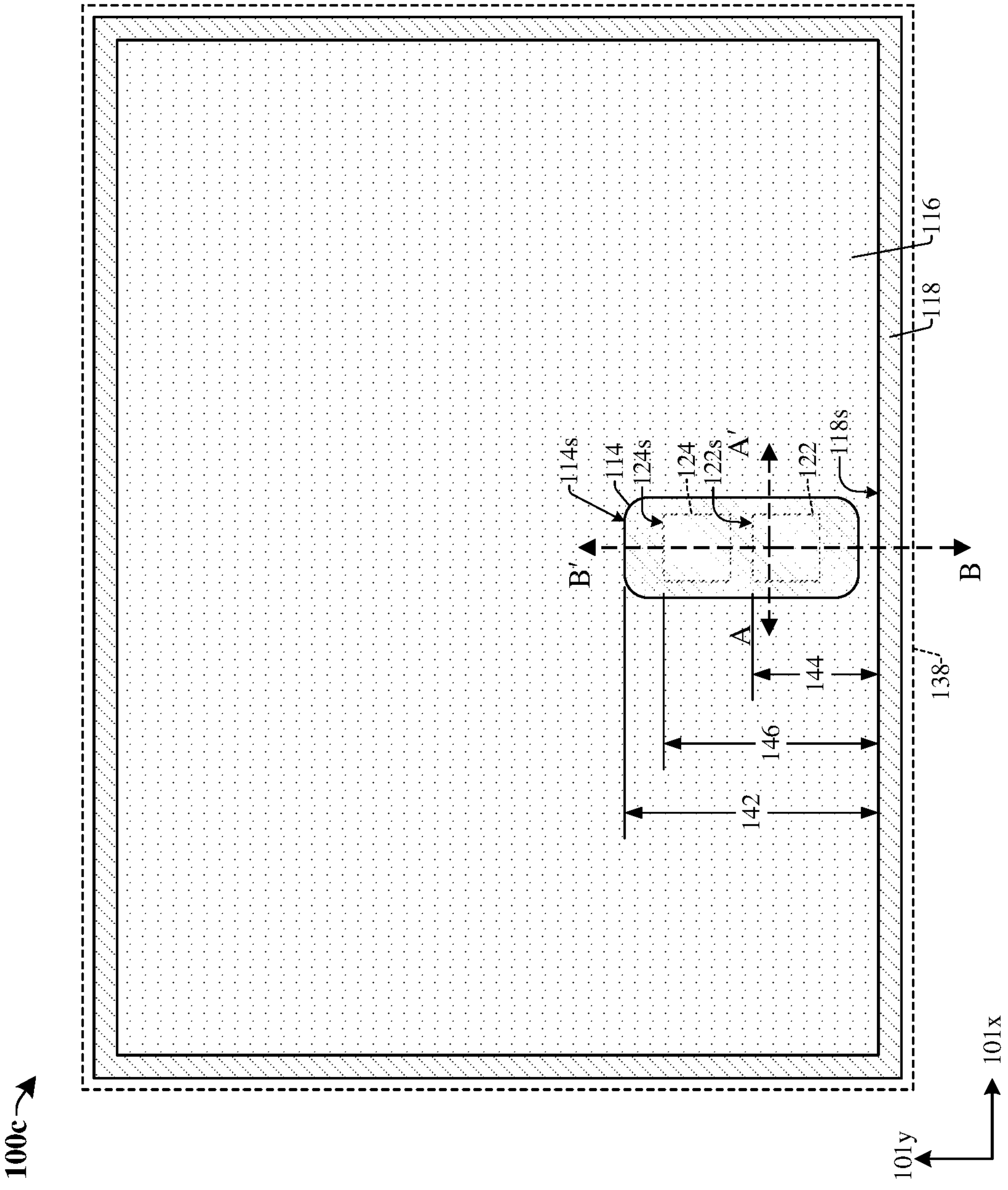
FIG. 1C illustrates a top view of some embodiments of the integrated chip of FIG. 1A and FIG. 1B.

FIG. 1A illustrates a cross-sectional view 100*a* of some embodiments of an integrated chip comprising a MIM array 120 arranged along a perimeter of the integrated chip. FIG. 1B illustrates another cross-sectional view 100*b* of some embodiments of the integrated chip of FIG. 1A. FIG. 1C illustrates a top view 100*c* of some embodiments of the integrated chip of FIG. 1A and FIG. 1B. In some embodiments, cross-sectional view 100*a* of FIG. 1A may, for example, be taken across line A-A' of FIG. 1C and cross-sectional view 100*b* of FIG. 1B may, for example, be taken across line B-B' of FIG. 1C. In some embodiments, cross-sectional view 100*a* of FIG. 1A is illustrated in an X-Z plane formed by x-axis 101*x* and *z*-axis 101*z*, cross-sectional view 100*b* of FIG. 1B is illustrated in a Y-Z plane formed by y-axis 101*y* and *z*-axis 101*z*, and top view 100*c* of FIG. 1C is illustrated in a X-Y plane formed by x-axis 101*x* and *y*-axis 101*y*.

The integrated chip comprises a transistor device 104 along a semiconductor substrate 102. A dielectric structure 106 comprising a plurality of dielectric layers is disposed over the substrate 102. An interconnect structure comprising a plurality of conductive interconnects 108 (e.g., contacts, metal lines, metal vias, conductive wires, bond pads, etc.) is within the dielectric structure 106. Conductive interconnects 108 of the interconnect structure are coupled to the transistor device 104.

A redistribution layer 110 is arranged over the conductive interconnects 108. The redistribution layer 110 is coupled to conductive interconnects 108 of the interconnect structure. A passivation layer 116 surrounds the redistribution layer 110. A metal bump 112 is arranged over the redistribution layer 110. An under-bump metal (UBM) layer 114 is directly between the redistribution layer 110 and the metal bump 112. The UBM layer 114 extends along a top surface of the redistribution layer 110 and a top surface of the passivation layer 116. The metal bump 112 is coupled to the redistribution layer 110 by the UBM layer 114. The UBM layer 114 and the metal bump 112 are arranged along a perimeter 138 of the integrated chip. A seal ring structure 118 laterally surrounds the conductive interconnects 108 and the redistribution layer 110 along the perimeter 138 of the integrated chip. In some embodiments, the seal ring structure 118 comprises a stack of metal isolation structures 140 (e.g., metal lines and metal vias).

The MIM array 120 comprises a plurality of MIM capacitors (e.g., 122, 124) coupled in parallel. For example, the MIM array 120 comprises a first MIM capacitor 122 and a second MIM capacitor 124. The first MIM capacitor 122 and the second MIM capacitor 124 are disposed at a first height over the substrate 102 and are laterally spaced apart by the dielectric structure 106. The first MIM capacitor 122 includes a first electrode 126 (e.g., a bottom electrode), a second electrode 128 (e.g., a top electrode), and an insulator layer 130 directly between the first electrode 126 and the second electrode 128. In some embodiments, a conductive interconnect 108 (e.g., a first conductive interconnect) is (e.g., forms) the first electrode 126. Similarly, the second MIM capacitor 124 includes a first electrode 132 (e.g., a bottom electrode), a second electrode 134 (e.g., a top electrode), and an insulator layer 136 directly between the first electrode 132 and the second electrode 134. In some embodiments, the conductive interconnect 108 that forms the first electrode 126 of the first MIM capacitor 122 (e.g., the first conductive interconnect) also forms the first electrode 132 of the second MIM capacitor 124.

The first MIM capacitor 122 the second MIM capacitor 124 are coupled in parallel by conductive interconnects 108 of the interconnect structure. For example, in some embodiments, the first electrode 126 of the first MIM capacitor 122 and the first electrode 132 of the second MIM capacitor 124 are coupled by the conductive interconnect 108 that forms the first electrodes 126, 132 (e.g., the first conductive interconnect). Further, another conductive interconnect 108 (e.g., a second conductive interconnect) is coupled to the second electrode 128 of the first MIM capacitor 122 and the second electrode 134 of the second MIM capacitor 124. Because the MIM capacitors (e.g., 122, 124) of the MIM array 120 are coupled in parallel, the capacitance of the MIM array 120 is equal to the sum of the capacitances of the MIM capacitors (e.g., 122, 124) of the MIM array 120.

The MIM capacitors (e.g., 122, 124) of the MIM array 120 have relatively small areas when viewed from above. For example, the areas of the MIM capacitors (e.g., 122, 124) are less than the area of the UBM layer when viewed from above. In some embodiments, an area of a MIM capacitor (e.g., the first MIM capacitor 122) of the MIM array 120 is less than or equal to 100 μm$^2$. In some embodiments, a MIM capacitor (e.g., the first MIM capacitor 122) of the MIM array 120 has a length and a width, where the width is greater than or equal to the length, and where the width is less than or equal to 10 micrometers.

The MIM capacitors of the MIM array 120 are arranged along the perimeter 138 of the integrated chip. For example, the MIM capacitors (e.g., 122, 124) are substantially close to the seal ring structure 118 and directly under the UBM layer 114. In some embodiments, the first MIM capacitor 122 and the second MIM capacitor 124 are directly under the UBM layer 114, which is adjacent to the seal ring structure 118. In some embodiments, the first MIM capacitor 122 and the second MIM capacitor 124 are directly under the metal bump 112. In some embodiments, a minimum distance between the seal ring structure 118 and the closest MIM capacitor (e.g., the first MIM capacitor 122) is substantially small. For example, in some embodiments, the minimum distance between the seal ring structure 118 and the closest MIM capacitor ranges from 5 micrometers to less than 50 micrometers or some other suitable range.

In some embodiments, the UBM layer 114 extends further away from the seal ring structure 118 than do the MIM capacitors of the MIM array 120. In other words, the MIM capacitors are between a sidewall of the UBM layer 114 and the seal ring layer. For example, a sidewall 114*s* of the UBM layer 114 that is furthest from a sidewall 118*s* of the seal ring 118 is laterally spaced apart from the sidewall 118*s* of the seal ring structure 118 by a first distance 142, a sidewall 122*s* of the first MIM capacitor 122 that is furthest from the sidewall 118*s* of the seal ring structure 118 is laterally spaced apart from the sidewall 118*s* of the seal ring structure 118 by a second distance 144, and a sidewall 124*s* of the second MIM capacitor 124 that is furthest from the sidewall 118*s* of the seal ring structure 118 is laterally spaced apart from the sidewall 118*s* of the seal ring structure 118 by a third distance 146, where the second distance 144 and the third distance 146 are less than the first distance 142.

Because the MIM capacitors have a reduced area, the MIM capacitors may be able to sustain higher stress without being significantly damaged. For example, stress put on the MIM array (e.g., during dicing and/or packaging) may have increased uniformity at each individual MIM capacitor of the MIM array because the individual MIM capacitors of the MIM array have reduced areas. Thus, the stress may be less likely to damage the MIM capacitors and render the MIM capacitors defective.

Because the MIM capacitors of the MIM array 120 can sustain higher stress, the MIM capacitors can be disposed directly under the UBM layer 114 and/or disposed substantially close to the seal ring structure 118 without facing a high risk of being damaged during dicing and/or packaging. By disposing the MIM capacitors directly under the UBM layer 114 and/or substantially close to the seal ring structure 118, the area of the chip can be better utilized (e.g., unutilized space can be reduced).

Although two MIM capacitors (e.g., 122, 124) are illustrated under the UBM layer 114 in FIGS. 1A, 1B, 1C, in some embodiments, the integrated chip may include some other number of MIM capacitors directly under the UBM layer 114. For example, a third MIM capacitor can be disposed directly under the UBM layer 114 and laterally spaced apart from the second MIM capacitor 124 so the second MIM capacitor 124 is between the first MIM capacitor 122 and the third MIM capacitor.

Figure 2A:
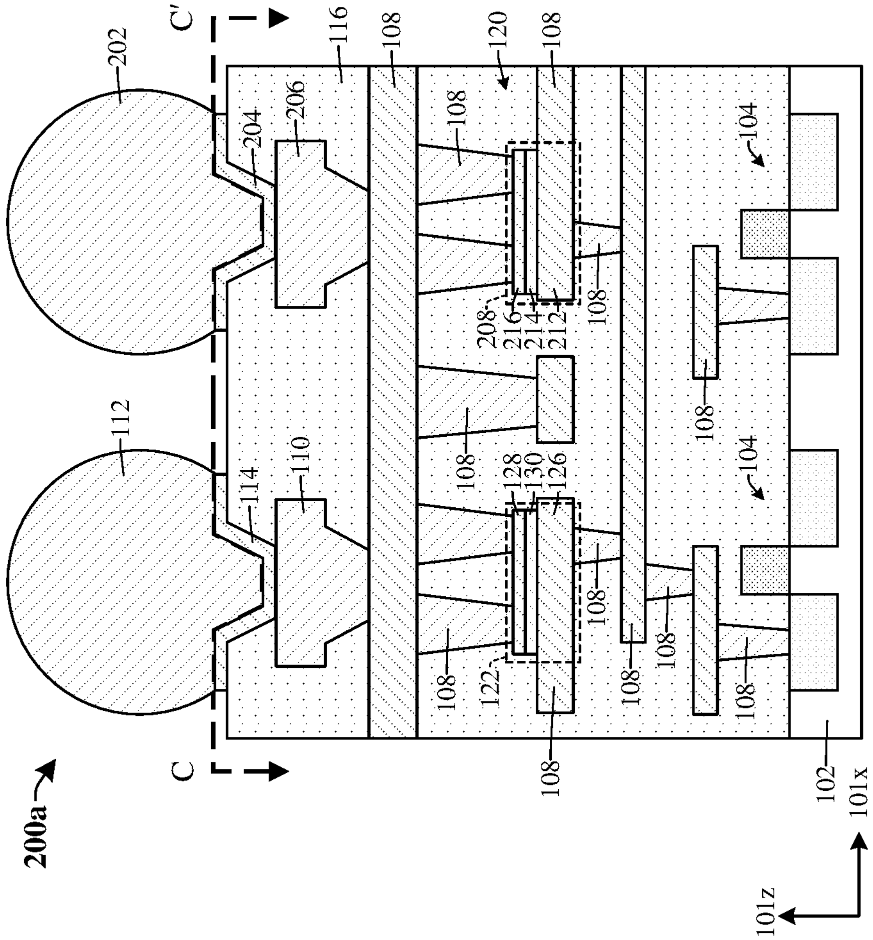
FIG. 2A illustrates a cross-sectional view of some embodiments of the integrated chip of FIG. 1A in which a plurality of metal bumps are disposed over a substrate.
Figure 2B:
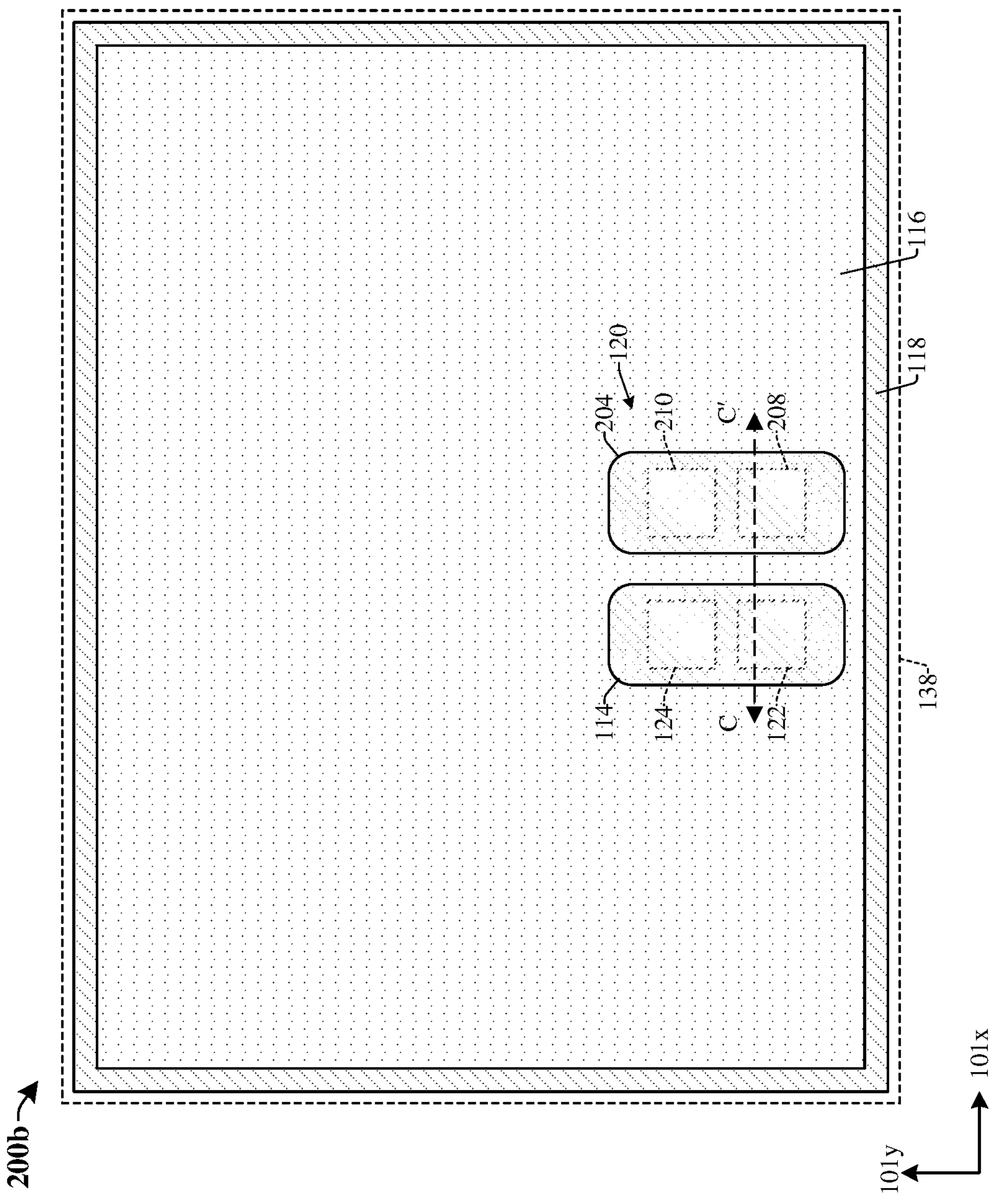
FIG. 2B illustrates a top views of some embodiments of the integrated chip of FIG. 2A.

FIG. 2A illustrates a cross-sectional view 200*a* of some embodiments of the integrated chip of FIG. 1A in which a plurality of metal bumps are disposed over the substrate 102. FIG. 2B illustrates a top view 200*b* of some embodiments of the integrated chip of FIG. 2A. In some embodiments, cross-sectional view 200*a* of FIG. 2A may, for example, be taken across line C-C' of FIG. 2B.

For example, the integrated chip includes the first metal bump 112 and a second metal bump 202 over a plurality of transistor devices 104 that are disposed along the substrate 102. The second metal bump 202 is laterally spaced apart from the first metal bump 112. The second metal bump 202 is over a second UBM layer 204. The second UBM layer 204 is separate from the first UBM layer 114. The second UBM layer 204 is over a second redistribution layer 206 that is laterally spaced apart from the first redistribution layer 110.

The MIM array 120 comprises a first plurality of MIM capacitors directly under the first UBM layer 114 and second plurality of MIM capacitors directly under the second UBM layer 204. For example, the first MIM capacitor 122 and the second MIM capacitor 124 are directly under the first UBM layer 114. Further, a third MIM capacitor 208 and a fourth MIM capacitor 210 are directly under the second UBM layer 204. The third MIM capacitor 208 comprises a first electrode 212, an insulator layer 214, and a second electrode 216. In some embodiments, the first electrode 212 is formed by a conductive interconnect 108. The fourth MIM capacitor 210 also comprises a first electrode (not shown), an insulator layer (not shown), and a second electrode (not shown).

The second plurality of MIM capacitors (e.g., the third MIM capacitor 208 and the fourth MIM capacitor 210) are coupled in parallel with the first plurality of MIM capacitors (e.g., the first MIM capacitor 122 and the second MIM capacitor 124). For example, the first electrodes of the MIM capacitors are coupled together and the second electrodes of the MIM capacitors are coupled together.

The third MIM capacitor 208 and the fourth MIM capacitor 210 are laterally spaced apart from one another (e.g., similar to the first MIM capacitor 122 and the second MIM capacitor 124) and from the first MIM capacitor 122 and the second MIM capacitor 124. For example, the second MIM capacitor 124 is laterally spaced apart from the first MIM capacitor 122 in a first direction (e.g., along y-axis 101*y*), and the fourth MIM capacitor 210 is laterally spaced apart from the third MIM capacitor 208 in the first direction (e.g., along y-axis 101*y*). Further, the third and fourth MIM capacitors 208, 210 are laterally spaced apart from the first and second MIM capacitors 122, 124 in a second direction (e.g., along x-axis 101*x*).

Figure 3A:
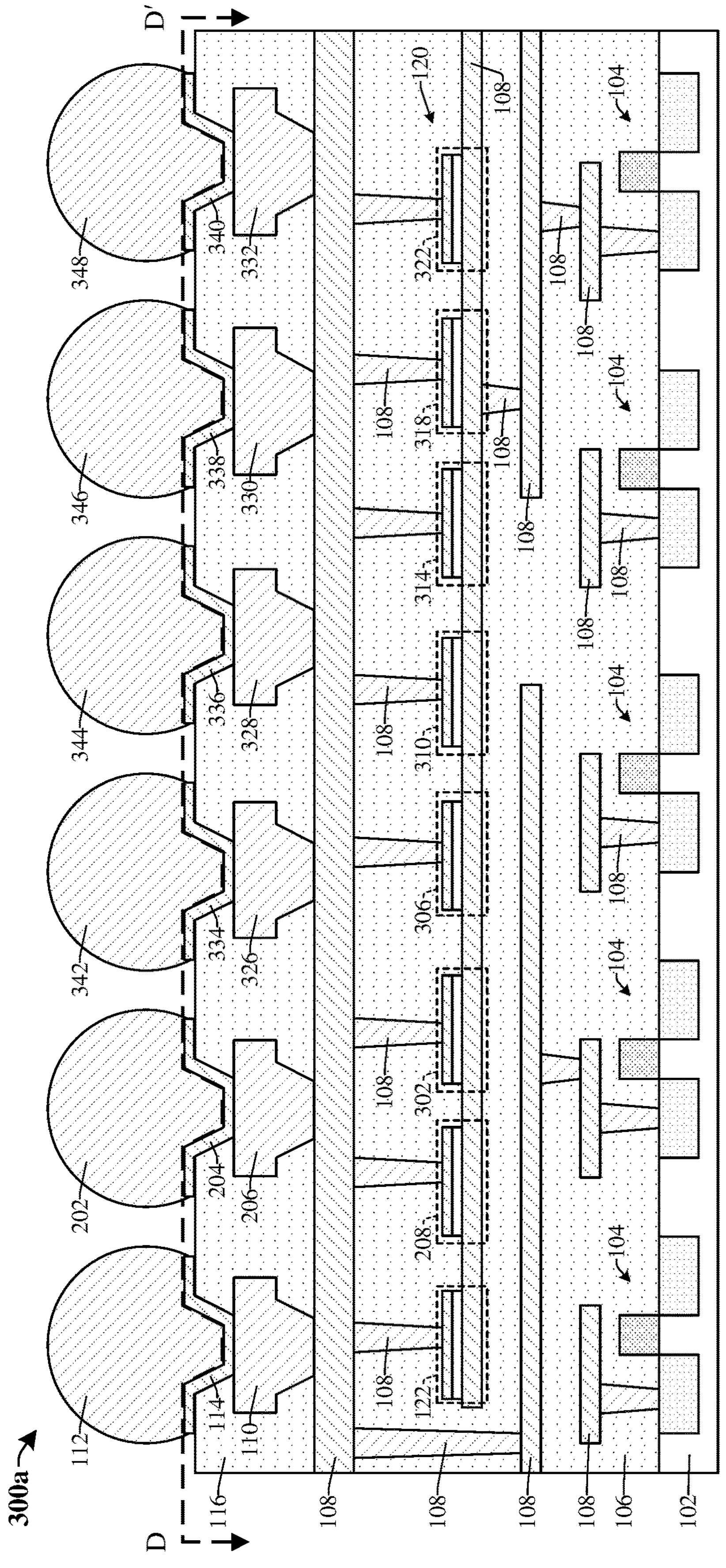
FIG. 3A illustrates a cross-sectional view of some embodiments of the integrated chip of FIG. 2A in which the lateral spacing between MIM capacitors of the MIM array is different than the lateral spacing between overlying under-bump metal (UBM) layers.
Figure 3B:
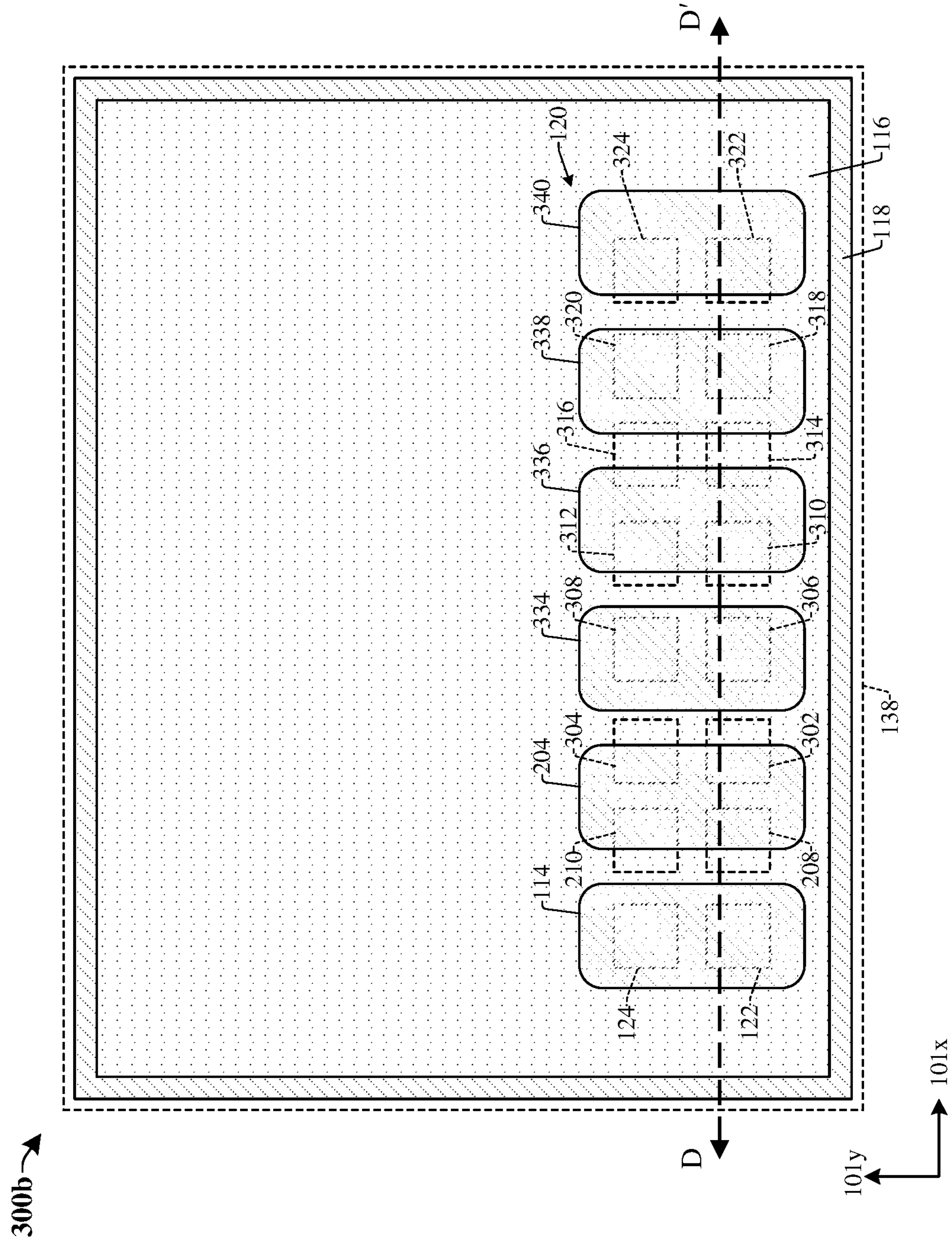
FIG. 3B illustrates a top view of some embodiments of the integrated chip of FIG. 3A.

FIG. 3A illustrates a cross-sectional view 300*a* of some embodiments of the integrated chip of FIG. 2A in which the lateral spacing between MIM capacitors of the MIM array 120 is different than the lateral spacing between UBM layers. FIG. 3B illustrates a top view 300*b* of some embodiments of the integrated chip of FIG. 3A. In some embodiments, cross-sectional view 300*a* of FIG. 3A may, for example, be taken across line D-D' of FIG. 3B.

The integrated chip comprises a plurality of MIM capacitors 122, 124, 208, 210, 302, 304, 306, 308, 310, 312, 314, 316, 318, 320, 322, 324 over a plurality of transistor devices 104. A plurality of redistribution layers 110, 206, 326, 328, 330, 332 are over the MIM capacitors. A plurality of UBM layers 114, 204, 334, 336, 338, 340 are over the redistribution layers. A plurality of metal bumps 112, 202, 342, 344, 346, 348 are over the UBM layers. In some embodiments, each of the MIM capacitors are coupled in parallel. For example, a conductive interconnect 108 (e.g., a first conductive interconnect) forms first electrodes of the MIM capacitors and second electrodes of the MIM capacitors are coupled together by another conductive interconnect 108 (e.g., a second conductive interconnect). In some embodiments, some of the MIM capacitors (e.g., 122) of the MIM array 120 are entirely under an overlying UBM layer (e.g., 114) while other MIM capacitors (e.g., 208) of the MIM array 120 are laterally offset from an overlying UBM layer (e.g., 204).

In some embodiments, some UBM layers (e.g., 114, 334) fully overlap underlying MIM capacitors (e.g., 122, 306). For example, a UBM layer (e.g., 114) is directly over sidewalls and a top surface of underlying MIM capacitors (e.g., 122, 124). Further, the top surfaces of the underlying MIM capacitors (e.g., 122, 124) are directly under a bottom surface of the overlying UBM layer (e.g., 114) and between sidewalls of the overlying UBM layer (e.g., 114).

In some embodiments, some UBM layers (e.g., 204, 336, 338, 340) partially overlap with underlying MIM capacitors. For example, top surfaces and sidewalls of underlying MIMs (e.g., 322, 324) extend from directly under an overlying UBM layer (e.g., 340) to laterally beyond a sidewall of the overlying UBM layer (e.g., 340) so that the sidewall of the overlying UBM layer (e.g., 340) is directly over the top surfaces of the underlying MIMs (e.g., 322, 324).

In some embodiments, some UBM layers (e.g., 338) are entirely over a first plurality of underlying MIM capacitors (e.g., 318, 320) and partially over a second plurality of underlying MIM capacitors (e.g., 314, 316). For example, a UBM layer (e.g., 338) is directly over sidewalls and top surfaces of a first plurality of MIM capacitors (e.g., 318, 320) and a sidewall of the UBM layer (e.g., 338) is directly over top surfaces of a second plurality of MIM capacitors (e.g., 314, 316).

In some embodiments, some UBM layers (e.g., 204) are partially over a first plurality of MIM capacitors (e.g., 208, 210) and partially over a second plurality of MIM capacitors (e.g., 302, 304). For example, a first sidewall of a UBM layer (e.g., 204) is directly over top surfaces of a first plurality of MIM capacitors (e.g., 208, 210) and a second sidewall of the UBM layer (e.g., 204) is directly over top surfaces of a second plurality of MIM capacitors (e.g., 302, 304).

In some embodiments, some MIM capacitors (e.g., 314, 316) extend directly under a two different UBM layers (e.g., 336, 338). For example, top surfaces of a plurality of MIM capacitors (e.g., 314, 316) are directly under a first UBM layer (e.g., 336) and also directly under a second UBM layer (e.g., 338).

Figure 4A:
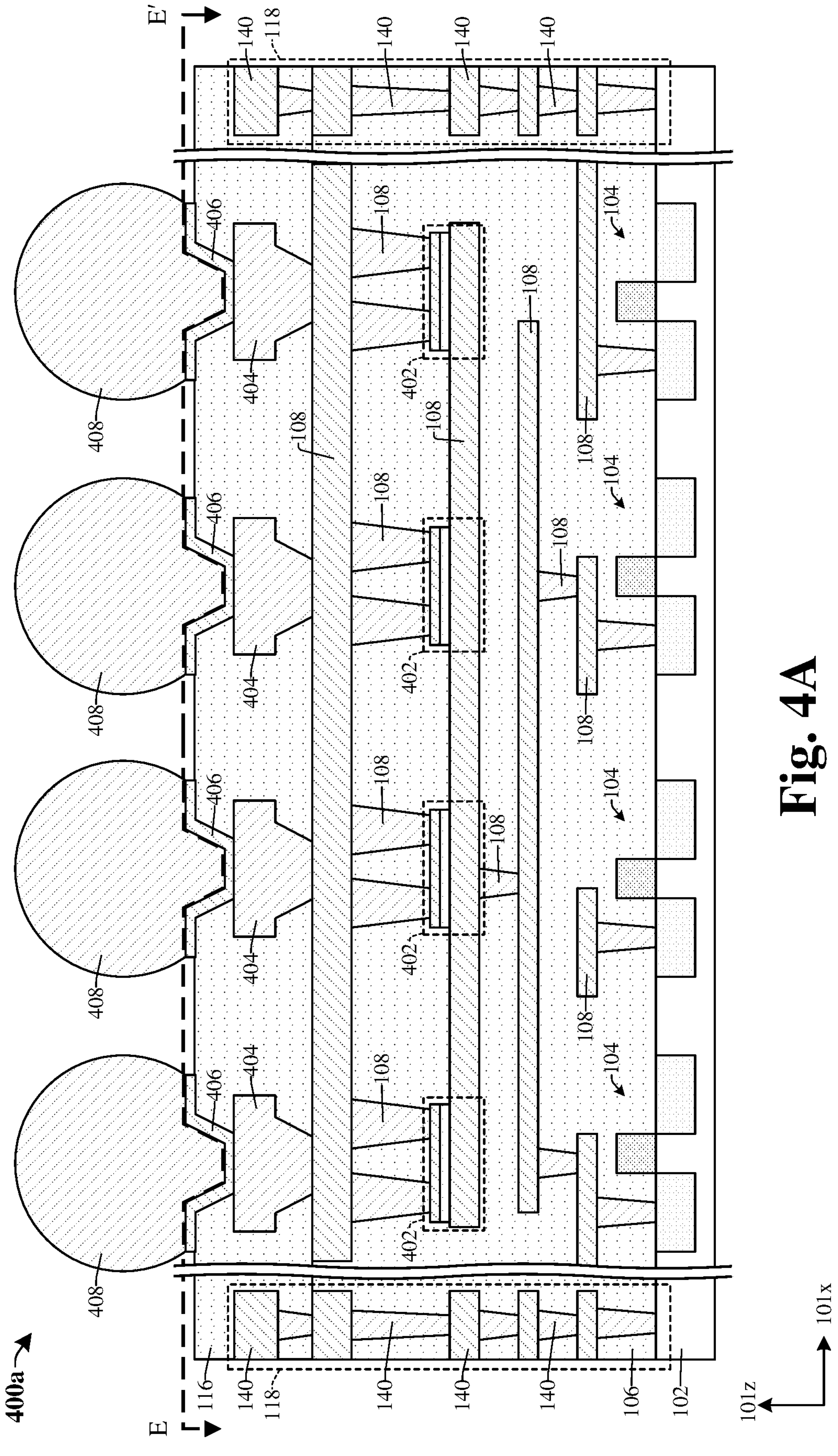
FIG. 4A illustrates a cross-sectional view of some embodiments an integrated chip comprising MIM capacitors and UBM layers arranged along a seal ring structure.
Figure 4B:
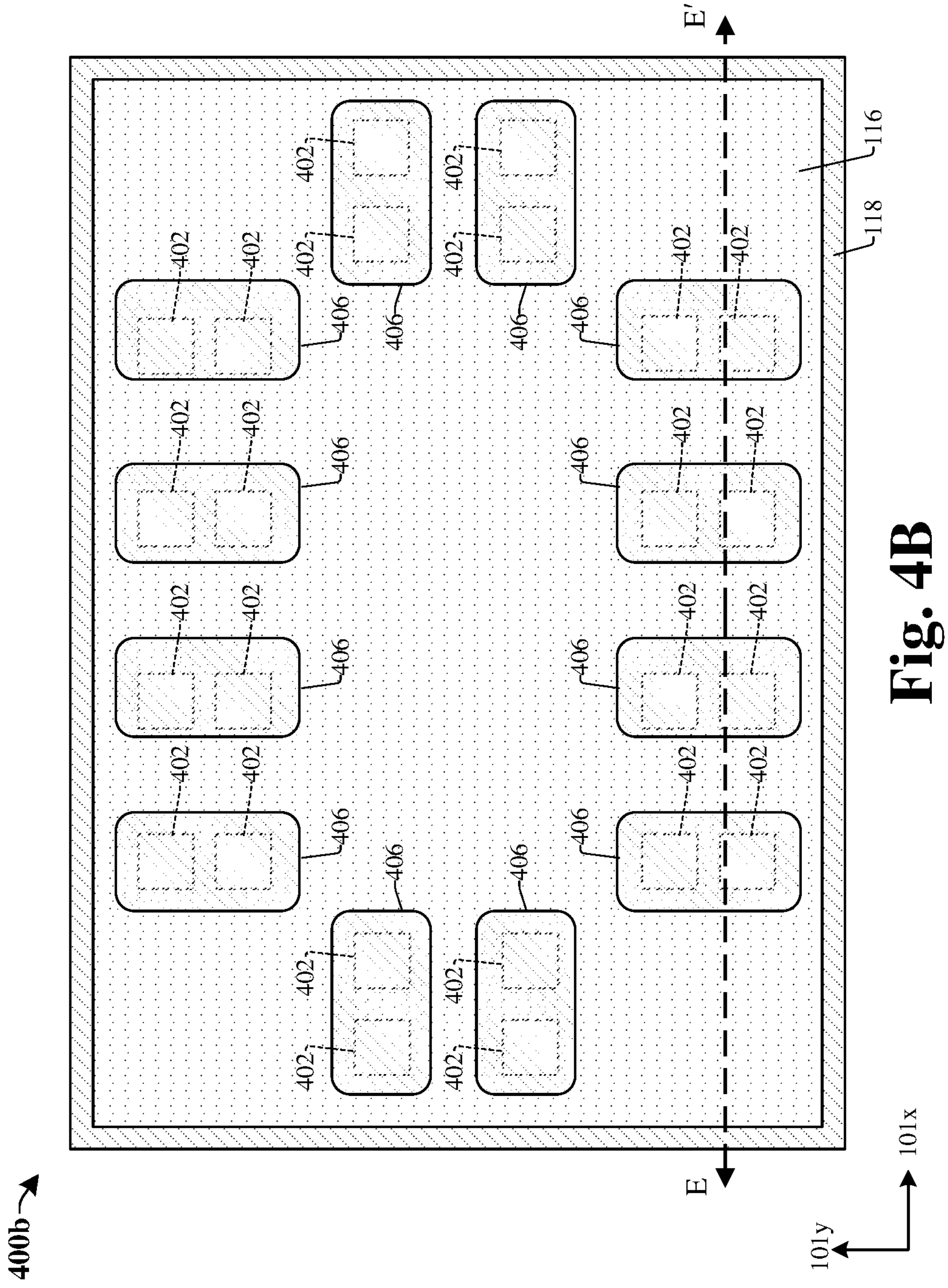
FIG. 4B illustrates a top view of some embodiments of the integrated chip of FIG. 4A.
Figure 5:
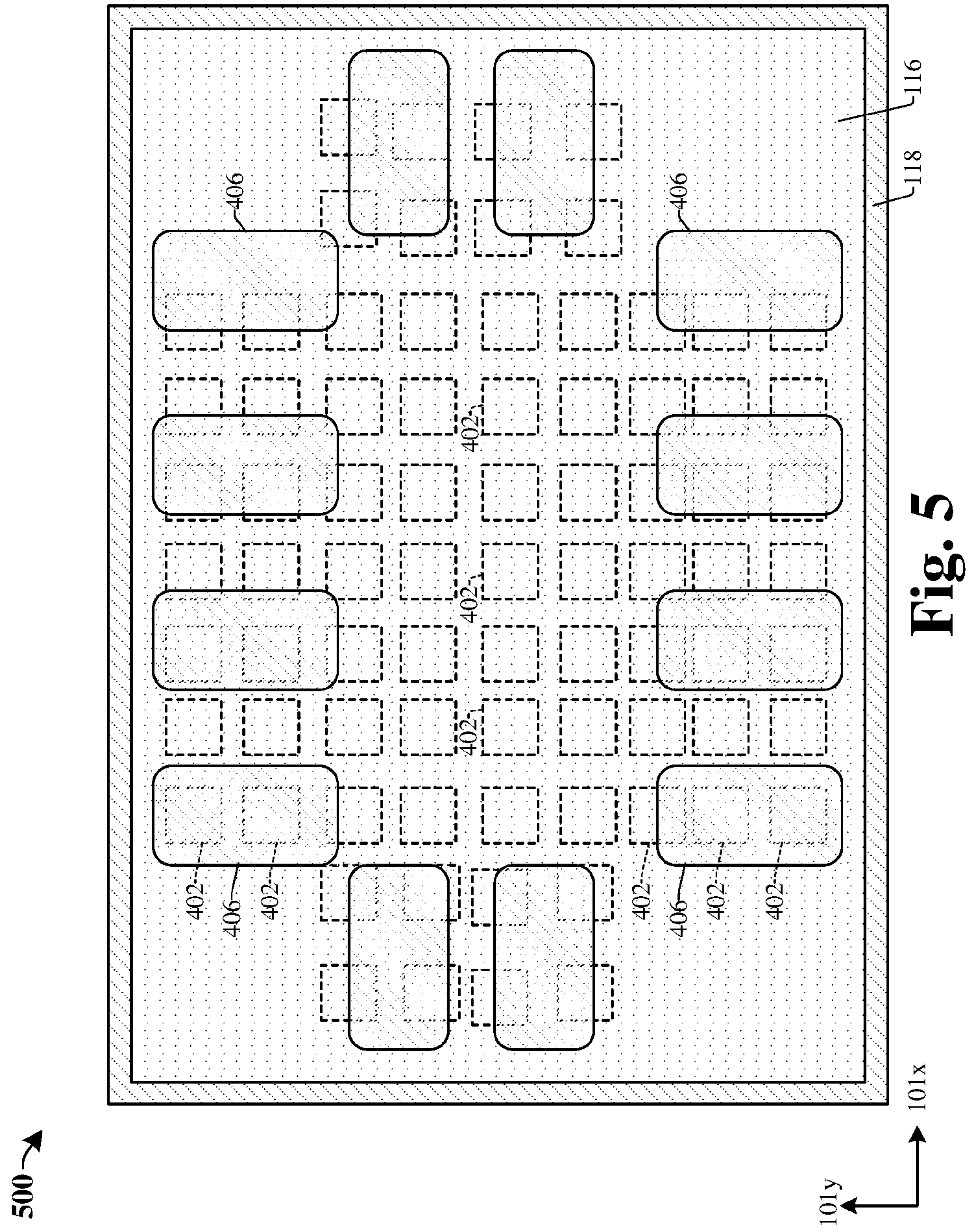
FIG. 5 illustrates a top view of some other embodiments of the integrated chip of FIG. 4B.
Figure 6:
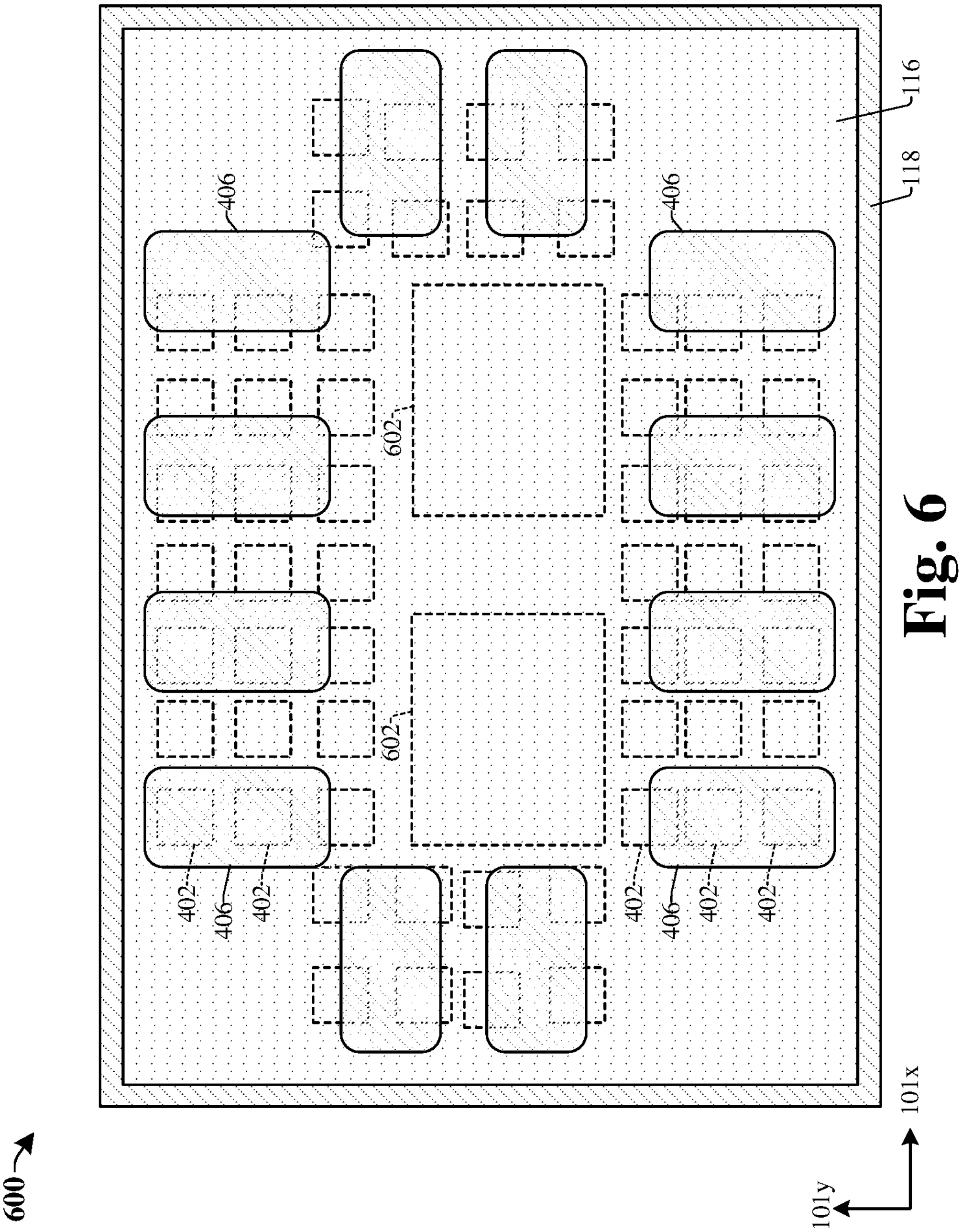
FIG. 6 illustrates a top view of some other embodiments of the integrated chip of FIG. 5.

FIG. 4A illustrates a cross-sectional view 400*a* of some embodiments an integrated chip comprising MIM capacitors 402 and UBM layers 406 arranged along a seal ring structure 118. FIG. 4B illustrates a top view 400*b* of some embodiments of the integrated chip of FIG. 4A. In some embodiments, cross-sectional view 400*a* of FIG. 4A may, for example, be taken across line E-E' of FIG. 4B. FIG. 5 illustrates a top view 500 of some other embodiments of the integrated chip of FIG. 4B. FIG. 6 illustrates a top view 600 of some other embodiments of the integrated chip of FIG. 5.

In some embodiments, the UBM layers 406 and the MIM capacitors 402 are arranged along each side of the seal ring structure 118. In some embodiments, MIM capacitors 402 are disposed directly under each of the UBM layers 406. In some embodiments, the MIM capacitors 402 are also directly under the redistribution layers 404 and the metal bumps 408.

In some embodiments (e.g., as illustrated in FIG. 5), the MIM capacitors 402 are also arranged between the UBM layers 406 (e.g., near a center of the integrated chip). For example, the MIM array extends beyond the UBM layers 406 toward the center of the integrated chip. The UBM layers 406 are arranged between some of the MIM capacitors 402 and the seal ring 118. In some embodiments, each of the MIM capacitors 402 in the MIM array are coupled in parallel. In some other embodiments, subsets of the MIM capacitors 402 are separately coupled in parallel to form a plurality of separate capacitor arrays. In some embodiments, the MIM capacitors 402 near the center of the chip have approximately the same size as the MIM capacitors 402 directly under the UBM layers 406.

In some embodiments (e.g., as illustrated in FIG. 6), MIM capacitors 602 near the center of the chip have increased sizes. The MIM capacitors 602 that are near the center of the chip (e.g., laterally between the UBM layers 406) can be large because they are laterally spaced apart from the seal ring structure 118 by a substantial distance and they are not disposed directly under the UBM layers 406 and hence substantial stress may not be put on these MIM capacitors 602 during dicing and/or packaging. Thus, the MIM capacitors 602 near the center of the chip can be larger without being damaged during dicing and/or packaging. In some embodiments, the areas of the MIM capacitors 602 near the center of the chip are substantially greater than the areas of the MIM capacitors 402 that are under the UBM layers 406. For example, the areas of the MIM capacitors 602 near the center of the chip may be greater than about 200 $\mu m^2$ or some other suitable value. In some embodiments, the larger MIM capacitors 602 are coupled in parallel with the smaller MIM capacitors 402.

Figure 7:
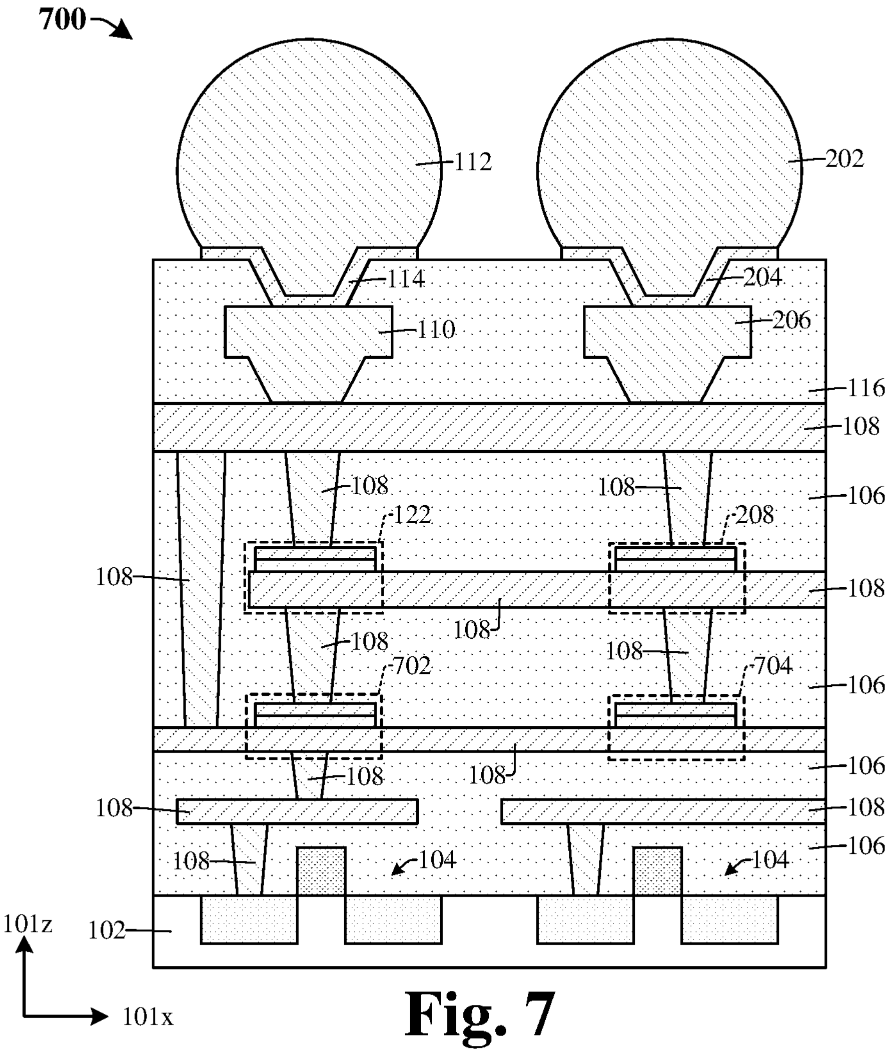
FIG. 7 illustrates a cross-sectional view of some embodiments of the integrated chip of FIG. 2A in which a second plurality of MIM capacitors are arranged over a first plurality of MIM capacitors.

FIG. 7 illustrates a cross-sectional view 700 of some embodiments of the integrated chip of FIG. 2A in which a second plurality of MIM capacitors are arranged over a first plurality of MIM capacitors.

For example, the MIM array comprises first MIM capacitors (e.g., 122, 208) and second MIM capacitors (e.g., 702, 704) directly over the first MIM capacitors. The first MIM capacitors 122, 208 are disposed at a first height over the substrate 102 and the second MIM capacitors 702, 704 are disposed at second height over the substrate 102, the second height being greater than the first height.

In some embodiments, the first MIM capacitors 122, 208 are coupled in parallel with the second MIM capacitors 702, 704. In some other embodiments, the first MIM capacitors 122, 208 are coupled in parallel with one another and the second MIM capacitors 702, 704 are separately coupled in parallel with one another but not with the first MIM capacitors 122, 208. Thus, in some embodiments, the MIM capacitors that are disposed at the different heights form separate MIM arrays.

Figure 8:
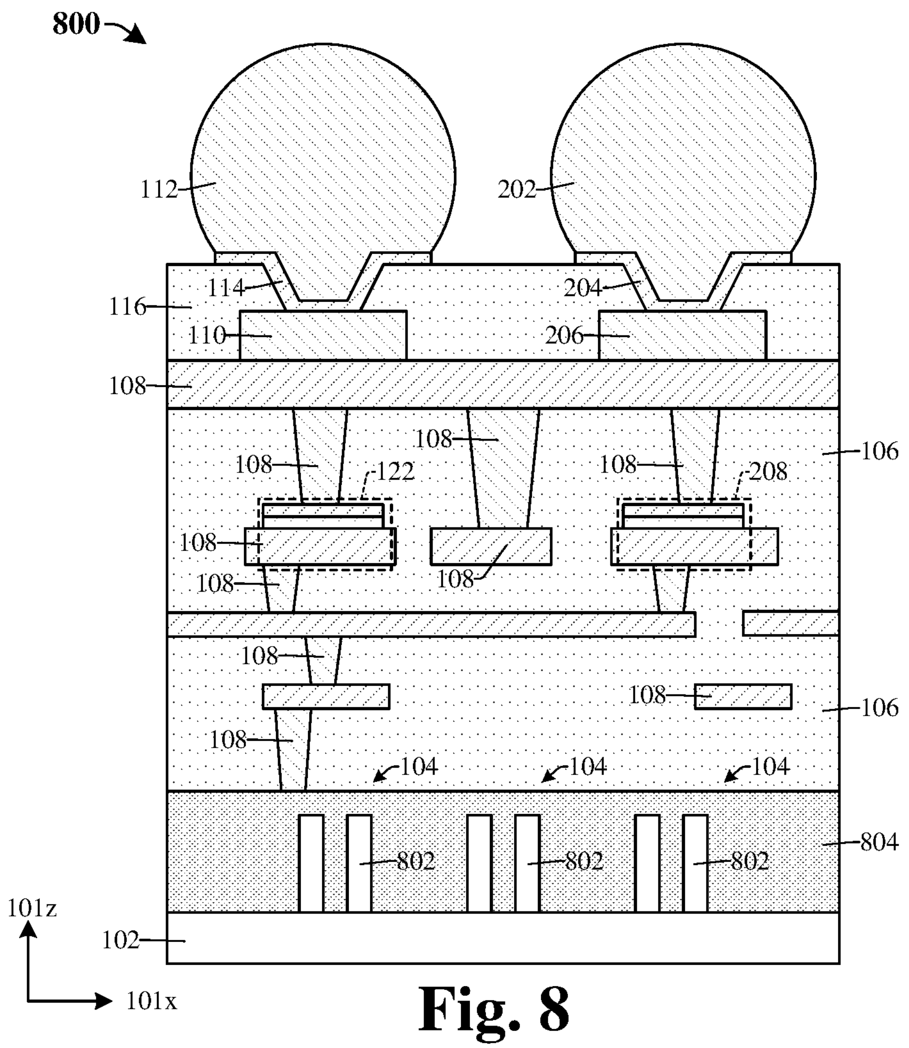
FIG. 8 illustrates a cross-sectional view of some embodiments of the integrated chip of FIG. 2A in which the transistor devices are fin-shaped field effect transistor (FET) devices.

FIG. 8 illustrates a cross-sectional view 800 of some embodiments of the integrated chip of FIG. 2A in which the transistor devices 104 are fin-shaped field effect transistor (FET) devices.

For example, the transistor devices 104 include an epitaxial semiconductor channel layer 802 that extends vertically over the in substrate 102 in a fin-shaped segments. Further, a gate layer 804 extends along sidewalls and over a top surface of the fin-shaped segments.

Figure 9:
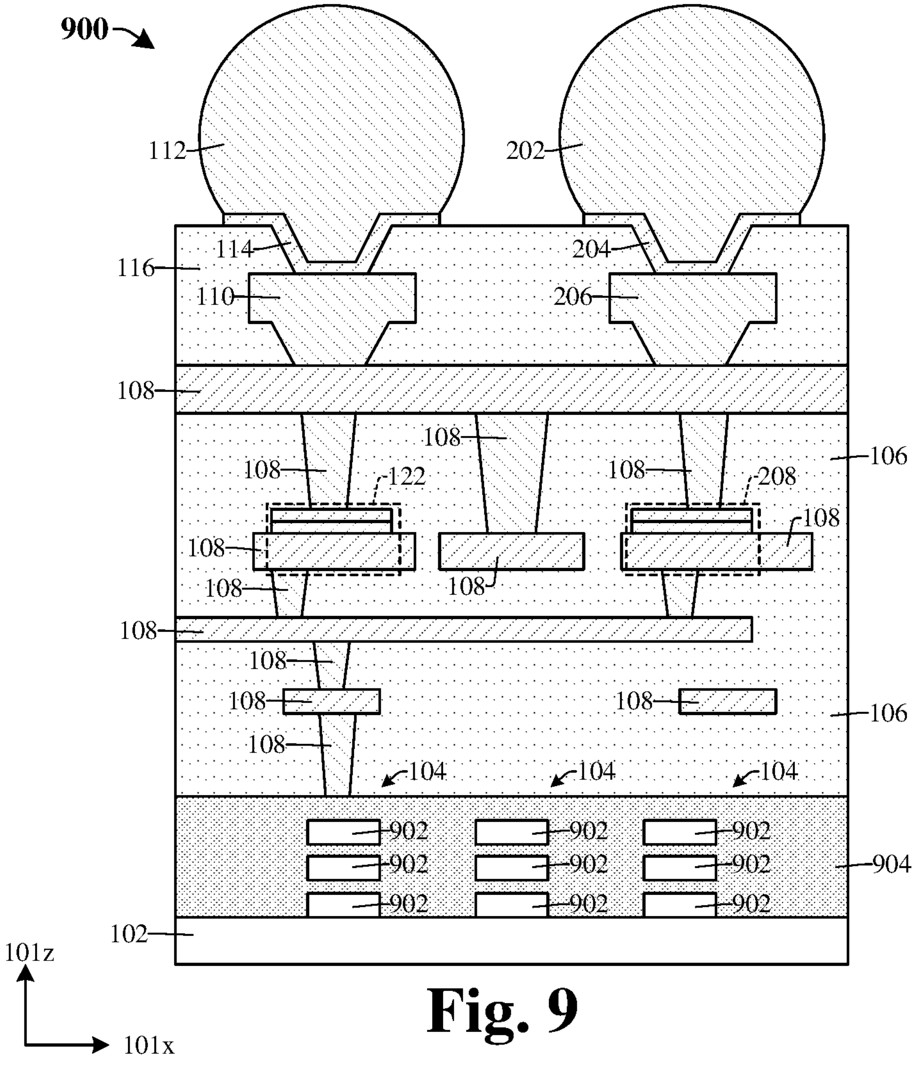
FIG. 9 illustrates a cross-sectional view of some embodiments of the integrated chip of FIG. 2A in which the transistor devices are nanosheet FET devices.

FIG. 9 illustrates a cross-sectional view 900 of some embodiments of the integrated chip of FIG. 2A in which the transistor devices 104 are nanosheet FET devices.

For example, the transistor devices 104 include an epitaxial semiconductor channel layer 902 that is disposed over the substrate 102 in nanosheet-shaped segments. The segments are stacked and vertically spaced apart from one another. Further, a gate layer 904 extends along the semiconductor channel layer 902 and between the nanosheet segments. These devices may alternatively be referred to as gate all-around FETs.

FIGS. 10-19 illustrate cross-sectional views 1000-1900 of some embodiments of a method for forming an integrated chip comprising a plurality of MIM capacitors along a perimeter of the integrated chip. Although FIGS. 10-19 are described in relation to a method, it will be appreciated that the structures disclosed in FIGS. 10-19 are not limited to such a method, but instead may stand alone as structures independent of the method.

Figure 10:
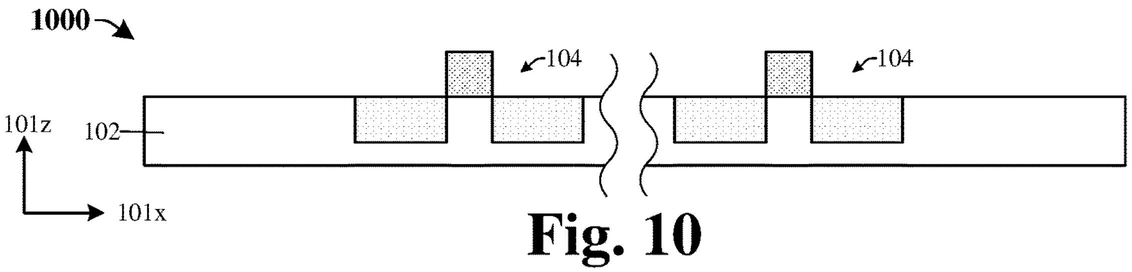
FIGS. 10-19 illustrate cross-sectional views of some embodiments of a method for forming an integrated chip comprising a plurality of MIM capacitors along a perimeter of the integrated chip

As shown in cross-sectional view 1000 of FIG. 10, a plurality of transistor devices 104 are formed along a substrate 102. In some embodiments, the transistors devices may, for example, be bipolar junction transistors, metal oxide semiconductor field effect transistors, junction field effect transistors, fin field effect transistors, nanosheet field effect transistors, gate all around field effect transistors, or the like. In some embodiments, the substrate 102 comprises silicon or some other suitable material.

Figure 11:
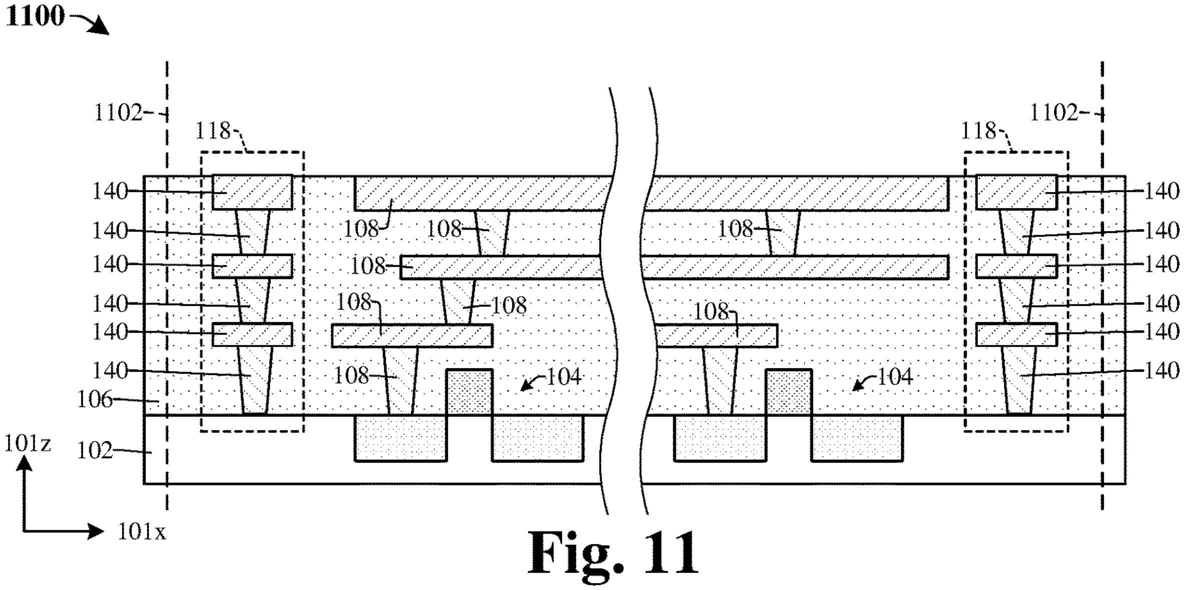

As shown in cross-sectional view 1100 of FIG. 11, a dielectric structure 106 and a plurality of conductive interconnects 108 are formed over the transistor devices 104. Further, a plurality of isolation structures 140 are formed around the conductive interconnects 108. For example, the isolation structures 140 are formed along scribe lines 1102 that surround the transistor devices 104 and the conductive interconnects 108. The isolation structures 140 form a seal ring structure 118 around the conductive interconnects 108 along the scribe lines 1102.

In some embodiments, the dielectric structure 106 comprises one or more dielectric layers which may, for example, comprise silicon dioxide, silicon nitride, silicon carbide, or some other suitable material. In some embodiments, the dielectric layers are deposited by a chemical vapor deposition (CVD) process, a physical vapor deposition (PVD) process, an atomic layer deposition (ALD) process, or some other suitable process. In some embodiments, the conductive interconnects 108 may, for example, comprise copper, tungsten, aluminum, or some other suitable material. In some embodiments, the conductive interconnects 108 are formed by etching the dielectric structure 106 and depositing the interconnects material over the etched dielectric structure 106 by a chemical vapor deposition (CVD) process, a physical vapor deposition (PVD) process, an atomic layer deposition (ALD) process, or some other suitable process. In some embodiments, the seal ring isolation structures 140 may, for example, comprise copper, tungsten, aluminum, or some other suitable material. In some embodiments, the seal ring isolation structures 140 are formed with a same or similar process as the conductive interconnects 108.

Figure 12:
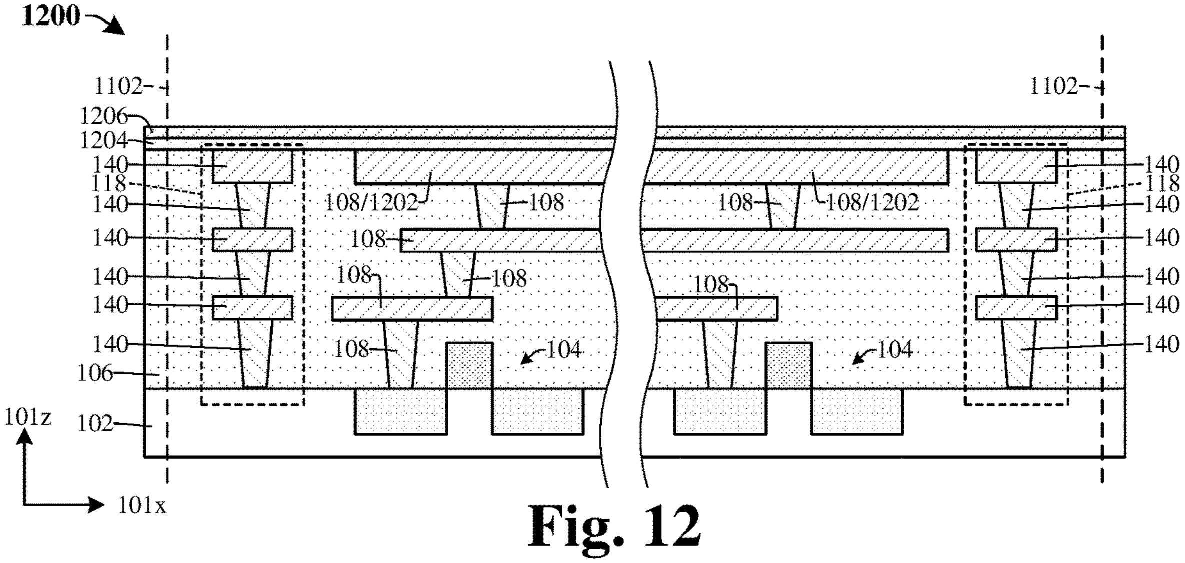

As shown in cross-sectional view 1200 of FIG. 12, a conductive interconnect 108 forms a first electrode layer 1202 and an insulator layer 1204 is deposited over the first electrode layer 1202. In some embodiments, the insulator layer 1204 may, for example, comprise silicon dioxide, silicon nitride, hafnium oxide, aluminum oxide, or some other suitable material. In some embodiments, the insulator layer 1204 is deposited by a CVD process, a PVD process, an ALD process, or some other suitable process.

Further, a second electrode layer 1206 is deposited over the insulator layer 1204. In some embodiments, the second electrode layer 1206 may, for example, comprise copper, tungsten, aluminum, or some other suitable material. In some embodiments, the second electrode layer 1206 is deposited by a CVD process, a PVD process, an ALD process, or some other suitable process.

Figure 13:
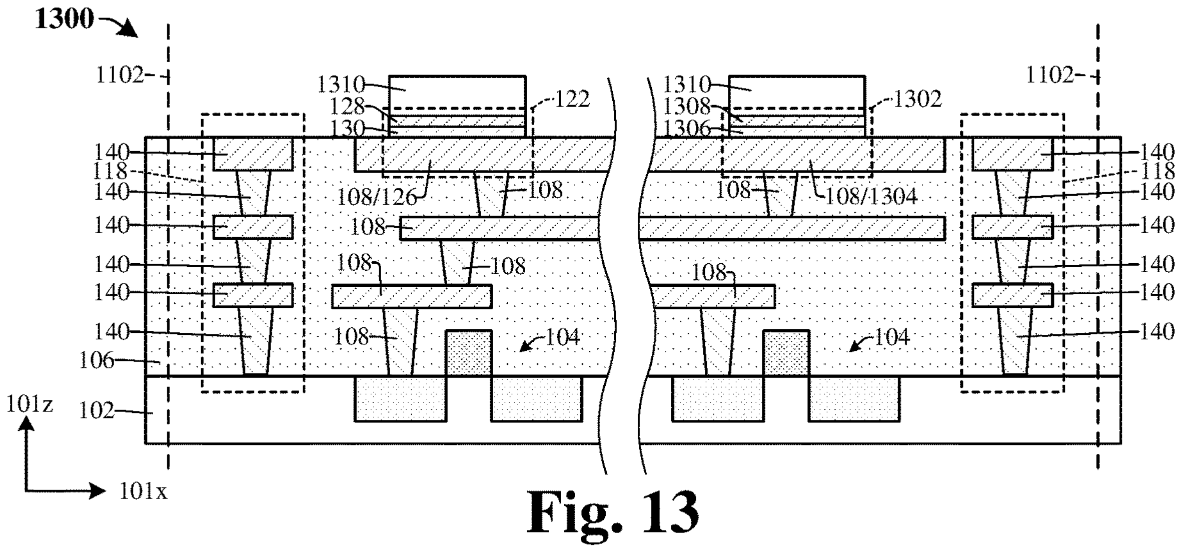

As shown in cross-sectional view 1300 of FIG. 13, the insulator layer (e.g., 1204 of FIG. 12) and the second electrode layer (e.g., 1206 of FIG. 12) are etched to form an array of MIM capacitors over the transistor devices 104. For example, the MIM array 120 comprises a plurality of MIM capacitors (e.g., a first MIM capacitor 122, a second MIM capacitor (e.g., 124 of FIG. 1B), a third MIM capacitor 1302, and a fourth MIM capacitor (not shown)) that are formed by the conductive interconnect 108 (e.g., the first electrode layer 1202 of FIG. 12), segments 130, 1306 of the insulator layer (1204 of FIG. 12), and segments 128, 1308 of the second electrode layer (e.g., 1206 of FIG. 12).

The MIM capacitors of the MIM array 120 are formed substantially close to the seal ring 118 (instead of being substantially spaced apart from the seal ring) to reduce an unutilized area of the integrated chip. For example, the MIM capacitors are formed so that a minimum distance between the seal ring structure 118 and the closest MIM capacitor ranges is less than 50 micrometers or some other suitable range. Further, the MIM capacitors are formed to have substantially small areas (e.g., when viewed from above) so that they can sustain higher stress during processing (e.g., dicing and/or packaging) without experiencing significant damage during processing. For example, the MIM capacitors are formed so that the areas of the MIM capacitors are less than 100 $\mu m^2$ or some other suitable value.

In some embodiments, a masking layer 1310 is formed over the second electrode layer and the etching is performed according to the masking layer 1310. In some embodiments, the etching comprises a dry etching process (e.g., a reactive ion etching process, an ion beam etching process, a plasma etching process, or some other suitable process). In some embodiments, the masking layer 1310 comprises photoresist, a hard mask, or some other suitable material. In some embodiments, the masking layer 1310 is removed after the etching.

Figure 14:
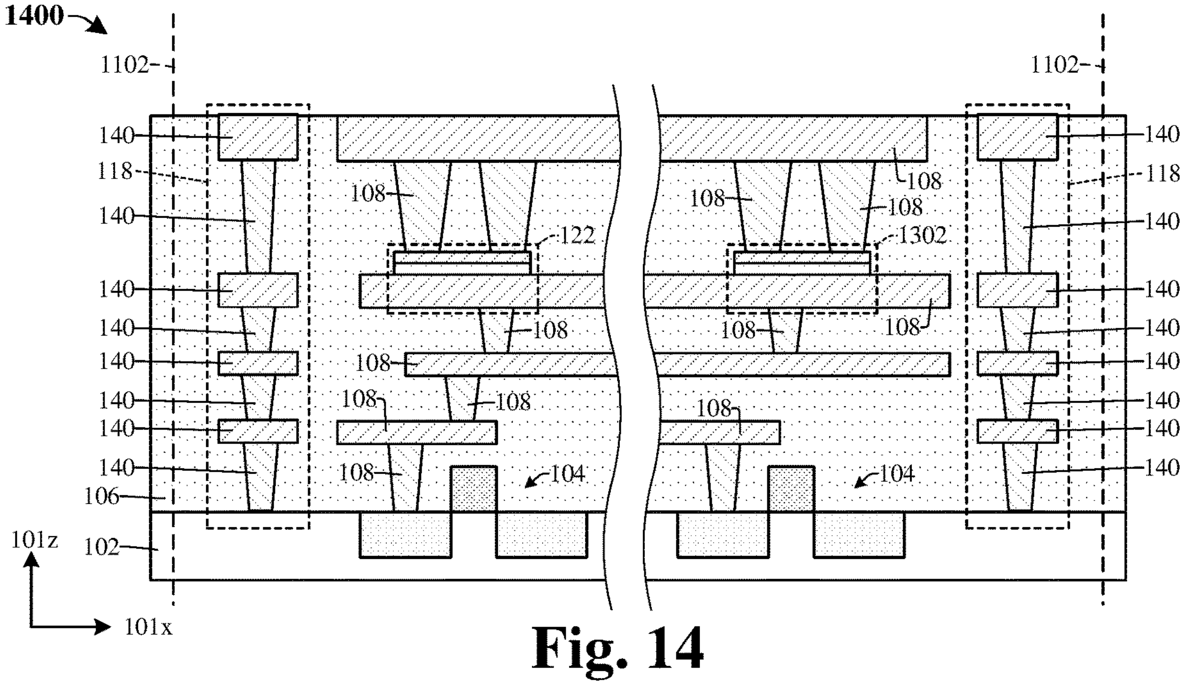

As shown in cross-sectional view 1400 of FIG. 14, additional conductive interconnects 108 are formed over the MIM capacitors 122, 1302. The conductive interconnects 108 are formed so that the MIM capacitors are coupled in parallel. Further, additional isolation structures 140 are formed to increase the height of the seal ring structure 118.

Figure 15:
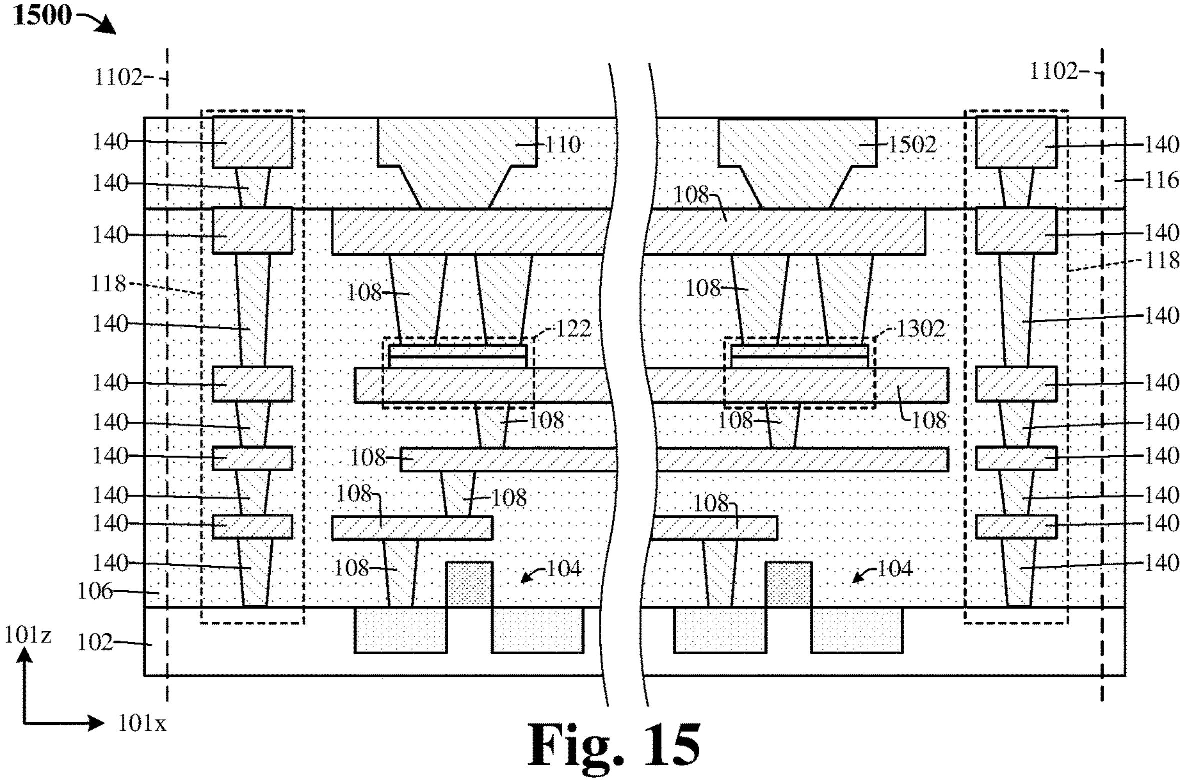

As shown in cross-sectional view 1500 of FIG. 15, redistribution layers 110, 1502 and a passivation layer 116 are formed over the MIM capacitors 122, 1302. In some embodiments, the redistribution layers 110, 1502 extend directly over the MIM capacitors 122, 1302, respectively. Further, additional isolations structures 140 are formed to increase the height of the seal ring structure 118.

In some embodiments, the redistribution layers 110, 1502 may, for example, comprise copper, tungsten, aluminum, or some other suitable material. In some other embodiments, the redistribution layers are formed by etching the passivation layer 116 and depositing the redistribution material over the etched passivation layer 116. The redistribution layer material may be deposited by a CVD process, a PVD process, an ALD process, or some other suitable process.

In some embodiments, the passivation layer 116 may, for example, comprise silicon dioxide, silicon nitride, or some other suitable material. In some embodiments, the passivation layer 116 is deposited by a CVD process, a PVD process, an ALD process, or some other suitable process.

Figure 16:
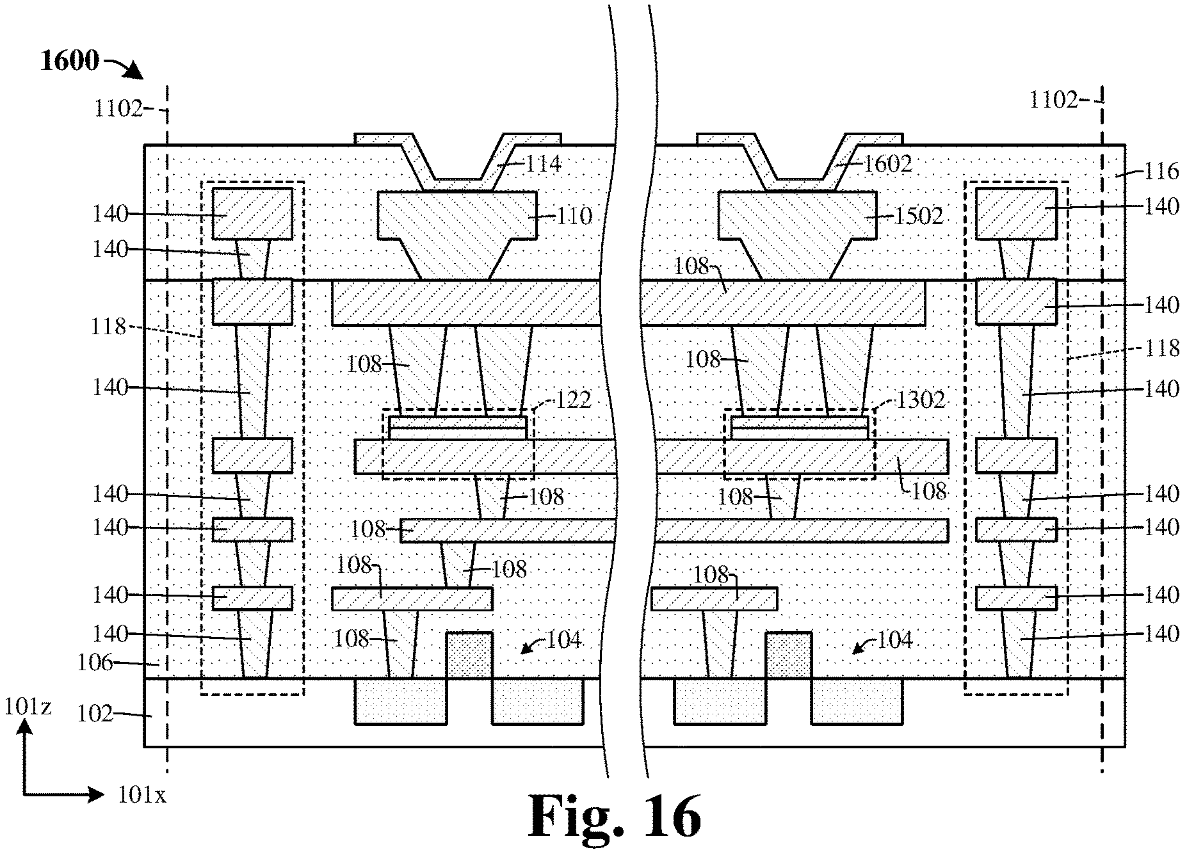

As shown in cross-sectional view 1600 of FIG. 16, additional passivation layer 116 is formed over the redistribution layers 110, 1502. Further, UBM layers 114, 1602 are formed over the redistribution layers 110, 1502 and directly over the MIM capacitors 122, 1302, respectively. For example, UBM layer 114 is formed directly over the first MIM capacitor 122 and the second MIM capacitor (e.g., 124 of FIG. 1B) and UBM layer 1602 is formed over the third MIM capacitor 1302 and the fourth MIM capacitor (not shown).

In some embodiments, the UBM layers 114, 1602 may, for example, comprise titanium, aluminum, nickel, copper, or some other suitable material. In some embodiments, the UBM layers 114, 1602 are formed by etching the passivation layer 116, depositing the UBM material over the etched passivation layer 116, and etching the UBM material to delimit the UBM layers 114, 1602. In some embodiments, the UBM material may, for example, be deposited by a CVD process, a PVD process, an ALD process, or some other suitable process.

Figure 17:
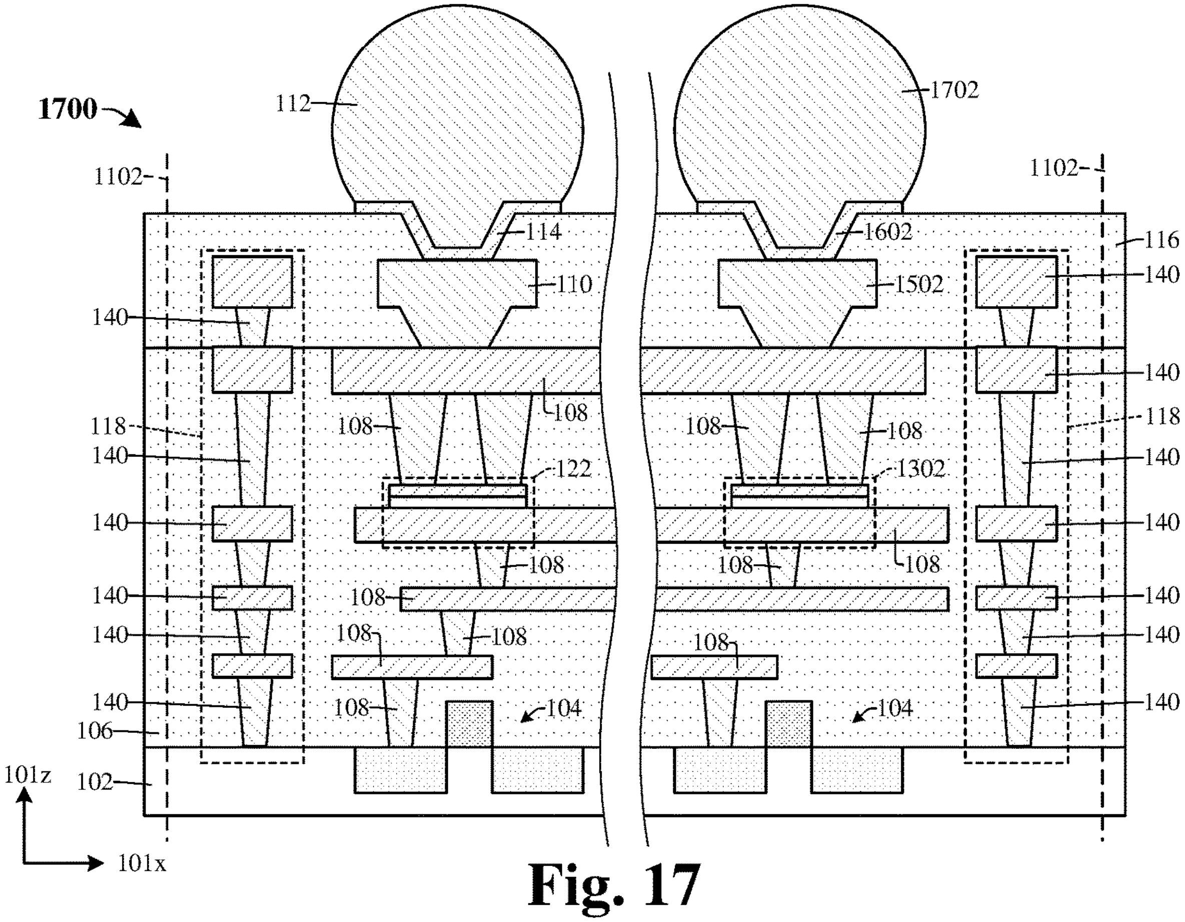

As shown in cross-sectional view 1700 of FIG. 17, metal bumps 112, 1702 are formed on the UBM layers 114, 1602. In some embodiments, the metal bumps 112, 1702 may, for example, comprise gold, lead, tin, or some other suitable material.

Figure 18:
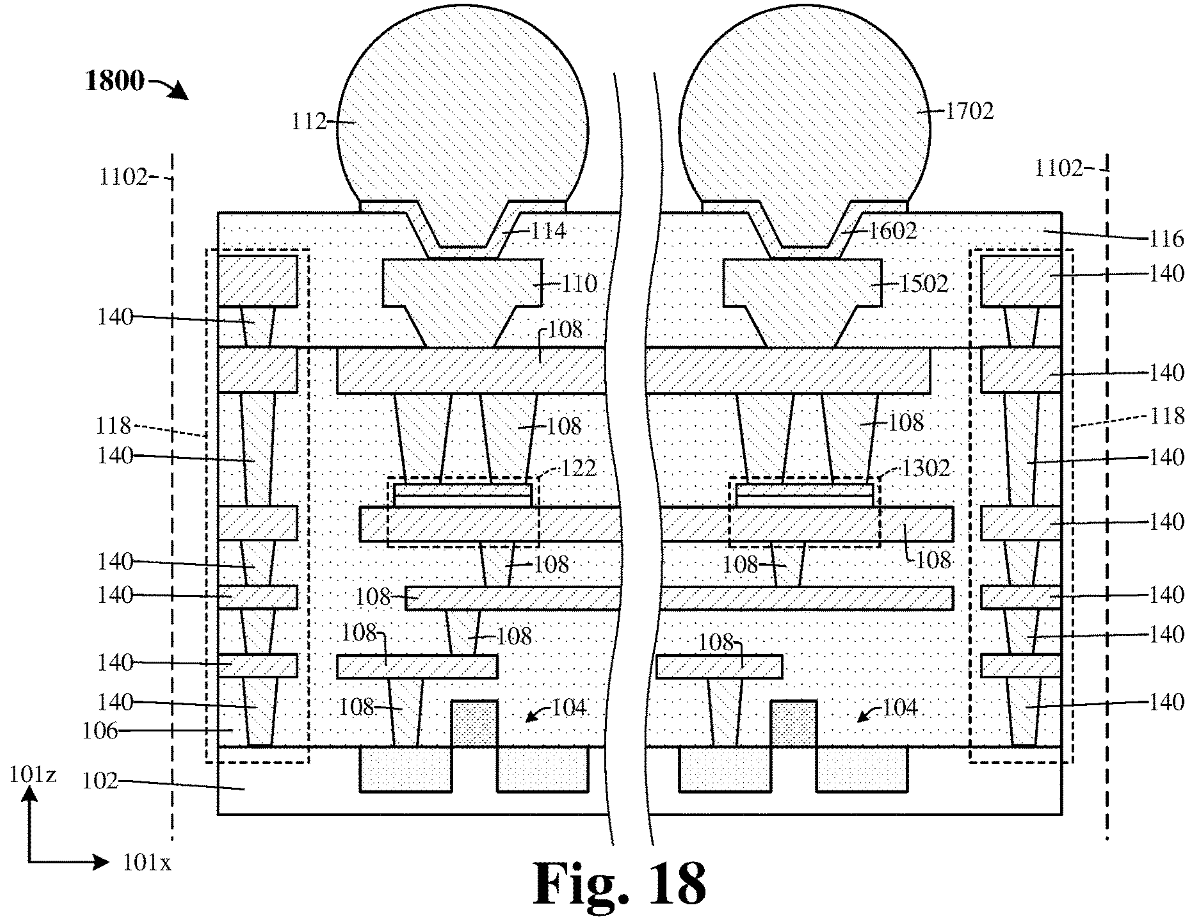

As shown in cross-sectional view 1800 of FIG. 18, the integrated chip is diced along the scribe lines 1102. For example, in some embodiments, a dicing blade is brought into contact with the integrated chip along the scribe lines 1102 to cut through the integrated chip along the scribe lines 1102, thereby dicing the integrated chip. In some embodiments, the dicing may put stress on the seal ring structure 118 and features close to the seal ring such as the MIM capacitors. However, because the MIM capacitors are substantially small, the MIM capacitors may be able to sustain the stress from the dicing without being damaged.

Figure 19:
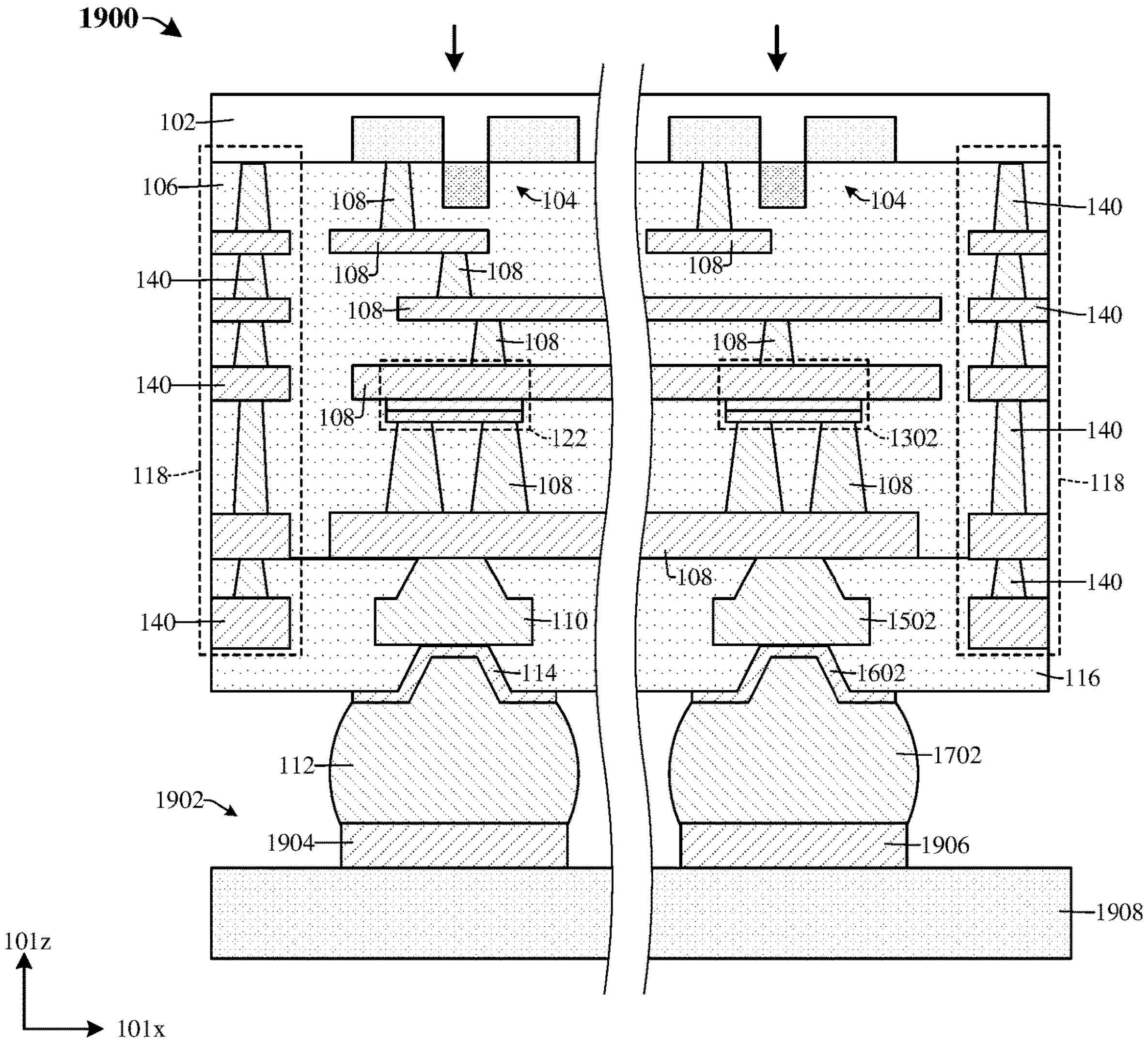

As shown in cross-sectional view 1900 of FIG. 19, the integrated chip is bonded to a circuit film structure 1902 at the metal bumps 112, 1702, thereby forming a chip-on-film (COF) device. For example, the metal bumps 112, 1702 are bonded to bond pads 1904, 1906, respectively, that are arranged along a circuit film layer 1908. In some embodiments, substantial downward force is applied during the bonding. The force may be transferred from the metal bumps 112, 1702 to underlying (or overlying, depending on orientation) features, including the MIM capacitors, during the bonding. The transferred force may put stress on the MIM capacitors. However, because the MIM capacitors are substantially small, the MIM capacitors may be able to sustain the stress without being damaged.

Figure 20:
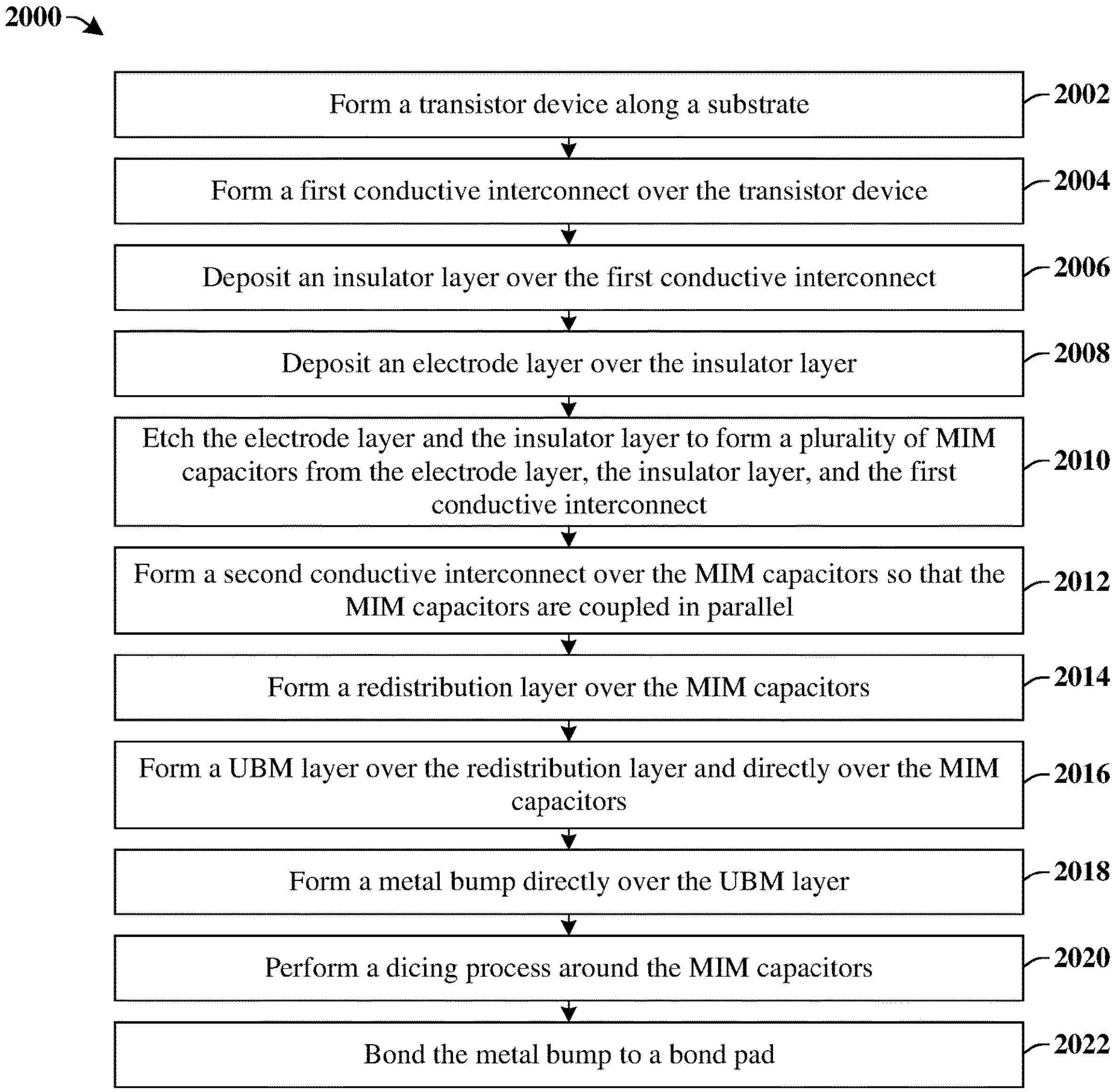
FIG. 20 illustrates a flow diagram of some embodiments of a method for forming an integrated chip comprising a plurality of MIM capacitors directly under a UBM layer.

FIG. 20 illustrates a flow diagram of some embodiments of a method 2000 for forming an integrated chip comprising a plurality of MIM capacitors directly under a UBM layer. While method 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 2002, form a transistor device along a substrate. FIG. 10 illustrates a cross-sectional view 1000 of some embodiments corresponding to block 2002.

At block 2004, form a first conductive interconnect over the transistor device. FIG. 11 illustrates a cross-sectional view 1100 of some embodiments corresponding to block 2004.

At block 2006, deposit an insulator layer over the first conductive interconnect. FIG. 12 illustrates a cross-sectional view 1200 of some embodiments corresponding to block 2006.

At block 2008, deposit an electrode layer over the insulator layer. FIG. 12 illustrates a cross-sectional view 1200 of some embodiments corresponding to block 2008.

At block 2010, etch the electrode layer and the insulator layer to form a plurality of MIM capacitors from the electrode layer, the insulator layer, and the first conductive interconnect. FIG. 13 illustrates a cross-sectional view 1300 of some embodiments corresponding to block 2010.

At block 2012, form a second conductive interconnect over the MIM capacitors so that the MIM capacitors are coupled in parallel. FIG. 14 illustrates a cross-sectional view 1400 of some embodiments corresponding to block 2012.

At block 2014, form a redistribution layer over the MIM capacitors. FIG. 15 illustrates a cross-sectional view 1500 of some embodiments corresponding to block 2014.

At block 2016, form a UBM layer over the redistribution layer and directly over the MIM capacitors. FIG. 16 illustrates a cross-sectional view 1600 of some embodiments corresponding to block 2014.

At block 2018, form a metal bump directly over the UBM layer. FIG. 17 illustrates a cross-sectional view 1700 of some embodiments corresponding to block 2018.

At block 2020, perform a dicing process around the MIM capacitors. FIG. 18 illustrates a cross-sectional view 1800 of some embodiments corresponding to block 2020.

At block 2022, bond the metal bump to a bond pad. FIG. 19 illustrates a cross-sectional view 1900 of some embodiments corresponding to block 2022.

Thus, the present disclosure relates to an integrated chip and a method for forming the integrated chip, the integrated chip including a MIM array disposed along the perimeter of the integrated chip for reducing unutilized space along the integrated chip.

Accordingly, in some embodiments, the present disclosure relates to an integrated chip including a substrate and a transistor device along the substrate. A plurality of conductive interconnects are over the transistor device. A first under-bump metal (UBM) layer is over the conductive interconnects. A first metal bump is directly over the first UBM layer. A metal-insulator-metal (MIM) capacitor array is over the transistor device and under the first UBM layer. The MIM capacitor array includes a first MIM capacitor and a second MIM capacitor coupled in parallel and disposed directly under the first UBM layer.

In other embodiments, the present disclosure relates to an integrated chip including a substrate, a transistor device along the substrate, and a plurality of conductive interconnects over the transistor device. A seal ring structure laterally surrounds the conductive interconnects. A first under-bump metal (UBM) layer is over the conductive interconnects and adjacent to the seal ring structure. A sidewall of the first UBM layer is laterally spaced apart from the seal ring structure by a first distance. A first metal bump is directly over the first UBM layer. A metal-insulator-metal (MIM) capacitor array is over the transistor device and under the first UBM layer. The MIM capacitor array includes a first MIM capacitor and a second MIM capacitor laterally spaced apart from the first MIM capacitor. The first MIM capacitor and the second MIM capacitor are coupled in parallel. A sidewall of the first MIM capacitor and a sidewall of the second MIM capacitor are laterally spaced apart from the seal ring structure by a second distance and a third distance, respectively. The second distance and the third distance are less than the first distance.

In yet other embodiments, the present disclosure relates to a method for forming an integrated chip. The method includes forming a transistor device along a substrate. A plurality of conductive interconnects are formed over the transistor device. A first conductive interconnect of the plurality of conductive interconnects forms a first electrode layer. An insulator layer is deposited over the first electrode layer. A second electrode layer is deposited over the insulator layer. The second electrode layer and the insulator layer are etched to form a first MIM capacitor and a second MIM capacitor from the second electrode layer, the insulator layer, and the first electrode layer. An under-bump metal (UBM) layer is formed directly over the first MIM capacitor and the second MIM capacitor. A metal bump is formed directly over the UBM layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:

forming a transistor device along a substrate;

forming a plurality of conductive interconnects over the transistor device, wherein a first conductive interconnect of the plurality of conductive interconnects forms a first electrode layer;

depositing an insulator layer over the first electrode layer;

depositing a second electrode layer over the insulator layer;

etching the second electrode layer and the insulator layer to form a first MIM capacitor and a second MIM capacitor from the second electrode layer, the insulator layer, and the first electrode layer, wherein the conductive interconnects are formed so that the first MIM capacitor and the second MIM capacitor are coupled in parallel;

forming an under-bump metal (UBM) layer directly over the first MIM capacitor and the second MIM capacitor; and forming a metal bump directly over the UBM layer.

2. The method of claim 1, further comprising:

forming a seal ring structure surrounding the conductive interconnects, wherein the UBM layer is formed adjacent to the seal ring structure.

3. The method of claim 2, further comprising:

dicing the integrated chip along the seal ring structure; and bonding the metal bump to a bond pad.

4. The method of claim 1, wherein a second conductive interconnect of the plurality of conductive interconnects forms a third electrode layer coupled to the first electrode layer, the method further comprising:

depositing the insulator layer over the third electrode layer; and depositing the second electrode layer over the insulator layer, wherein etching the second electrode layer and the insulator layer forms a third MIM capacitor from the second electrode layer, the insulator layer, and the third electrode layer, wherein the second MIM capacitor is laterally spaced apart from the first MIM capacitor in a first direction, wherein the third MIM capacitor is laterally spaced apart from the first MIM capacitor in a second direction.

5. The method of claim 4, wherein the UBM layer is formed directly over the third MIM capacitor.

6. The method of claim 4, further comprising:

forming a second UBM layer laterally spaced from the UBM layer and directly over the third MIM capacitor.

7. A method for forming an integrated chip, the method comprising:

forming a transistor device along a semiconductor substrate;

forming a plurality of conductive interconnects over the transistor device;

forming a seal ring structure laterally surrounding the plurality of conductive interconnects;

forming a metal-insulator-metal (MIM) capacitor array over the transistor device, the MIM capacitor array comprising a first MIM capacitor and a second MIM capacitor, wherein the second MIM capacitor is laterally spaced from the first MIM capacitor and coupled in parallel with the first MIM capacitor, and wherein the first and second MIM capacitors are laterally spaced from the seal ring structure and laterally surrounded by the seal ring structure;

forming a first under-bump metal (UBM) layer directly over the first MIM capacitor and the second MIM capacitor and laterally spaced from the seal ring structure; and forming a first metal bump on the first UBM layer.

8. The method of claim 7, further comprising:

forming a second UBM layer laterally spaced apart from the first UBM layer; and forming a second metal bump on the second UBM layer, the MIM capacitor array further comprising a third MIM capacitor coupled in parallel with the first MIM capacitor and the second MIM capacitor, wherein the second MIM capacitor is laterally spaced apart from the first MIM capacitor in a first direction, wherein the third MIM capacitor is laterally spaced apart from the first MIM capacitor in a second direction, wherein the second UBM layer is directly over the third MIM capacitor.

9. The method of claim 8, wherein the first UBM is directly over the third MIM capacitor.

10. The method of claim 7, wherein a sidewall of the first UBM layer is laterally spaced apart from the seal ring structure by a first distance, and wherein a sidewall of the first MIM capacitor and a sidewall of the second MIM capacitor are laterally spaced apart from the seal ring structure by a second distance and a third distance, respectively, and wherein the second distance and the third distance are less than the first distance.

11. The method of claim 7, further comprising:

forming a redistribution layer between the first UBM layer and the MIM capacitor array, wherein the redistribution layer is directly over the first MIM capacitor and the second MIM capacitor.

12. The method of claim 7, wherein a minimum distance between the seal ring structure and the first MIM capacitor is less than 50 micrometers.

13. The method of claim 7, wherein the first MIM capacitor has a length and a width, wherein the width is greater than or equal to the length, and wherein the width is less than or equal to 10 micrometers.

14. A method of forming an integrated chip, the method comprising:

forming a transistor device along a substrate;

forming a first conductive interconnect over and coupled to the transistor device;

forming a first lower electrode over and coupled to the first conductive interconnect;

forming a first insulator and a second insulator on the first lower electrode;

forming a first upper electrode on the first insulator and forming a second upper electrode on the second insulator, wherein the first lower electrode, the first insulator, and the first upper electrode form a first metal-insulator-metal (MIM) capacitor, and wherein the first lower electrode, the second insulator, and the second upper electrode form a second MIM capacitor;

forming a second conductive interconnect coupled to the first upper electrode and the second upper electrode;

forming a first under-bump metal (UBM) layer over and coupled to the second conductive interconnect, wherein a perimeter of the first UBM layer surrounds a perimeter of the first MIM capacitor and a perimeter of the second MIM capacitor in top view; and forming a first metal bump on the first UBM layer.

15. The method of claim 14, further comprising:

forming a second lower electrode over and coupled to the first conductive interconnect;

forming a third insulator on the second lower electrode; and forming a third upper electrode on the third insulator, wherein the second lower electrode, the third insulator, and the third upper electrode form a third MIM capacitor, wherein the third MIM capacitor is laterally spaced from the first MIM capacitor and the second MIM capacitor, wherein the second conductive interconnect is coupled to the third upper electrode, and wherein a perimeter of the third MIM capacitor intersects the perimeter of the first UBM layer in top view.

16. The method of claim 15, further comprising:

forming a second UBM layer over and coupled to the second conductive interconnect, wherein a perimeter of the second UBM layer intersects the perimeter of the third MIM capacitor in top view; and forming a second metal bump on the second UBM layer.

17. The method of claim 14, further comprising:

forming a third MIM capacitor laterally offset from the first UBM layer, wherein an area of the third MIM capacitor is greater than an area of the first MIM capacitor and an area of the second MIM capacitor.

18. The method of claim 14, further comprising:

forming a third MIM capacitor coupled in parallel with the first MIM capacitor and the second MIM capacitor, wherein the first MIM capacitor is formed over the third MIM capacitor, and wherein the perimeter of the first UBM layer surrounds a perimeter of the third MIM capacitor in top view.

19. The method of claim 14, further comprising:

forming a metal seal ring laterally surrounding the first MIM capacitor and the second MIM capacitor and laterally spaced from the first MIM capacitor and the second MIM capacitor.

20. The method of claim 14, wherein the second conductive interconnect extends over both the first upper electrode and the second upper electrode.

* * * * *